United States Patent
Won

(10) Patent No.: US 10,936,534 B2
(45) Date of Patent: Mar. 2, 2021

(54) CONVERGED MEMORY DEVICE AND METHOD THEREOF

(71) Applicant: SK hynix Inc., Icheon (KR)

(72) Inventor: Hyung-Sik Won, Cheongju (KR)

(73) Assignee: SK hynix Inc., Icheon (KR)

(*) Notice: Subject to any disclaimer, the term of this patent is extended or adjusted under 35 U.S.C. 154(b) by 58 days.

(21) Appl. No.: 16/122,615

(22) Filed: Sep. 5, 2018

(65) Prior Publication Data

US 2019/0146945 A1 May 16, 2019

(30) Foreign Application Priority Data

Nov. 10, 2017 (KR) .................. 10-2017-0149360

(51) Int. Cl.
| | |
|---|---|
| G06F 15/173 | (2006.01) |
| G11C 7/06 | (2006.01) |
| G06F 13/40 | (2006.01) |
| G06F 15/16 | (2006.01) |
| G11C 7/18 | (2006.01) |
| G11C 11/4097 | (2006.01) |
| G11C 11/4091 | (2006.01) |
| G11C 5/02 | (2006.01) |

(52) U.S. Cl.
CPC .... *G06F 15/17331* (2013.01); *G06F 13/4022* (2013.01); *G06F 15/161* (2013.01); *G11C 5/025* (2013.01); *G11C 7/06* (2013.01); *G11C 7/18* (2013.01); *G11C 11/4091* (2013.01); *G11C 11/4097* (2013.01); *G11C 2207/002* (2013.01); *G11C 2207/005* (2013.01); *G11C 2207/2236* (2013.01)

(58) Field of Classification Search
CPC .......... G06F 15/17331; G06F 13/4022; G06F 15/161; G11C 5/025
USPC ...................................................... 709/212
See application file for complete search history.

(56) References Cited

U.S. PATENT DOCUMENTS

| | | | |
|---|---|---|---|
| 5,657,281 A | 8/1997 | Rao | |
| 5,867,642 A | 2/1999 | Vivio et al. | |
| (Continued) | | | |

FOREIGN PATENT DOCUMENTS

KR 1020160141484 A 12/2016

OTHER PUBLICATIONS

Office Action dated Mar. 23, 2020 for U.S. Appl. No. 16/568,111.
Office Action dated Jul. 14, 2020 for U.S. Appl. No. 16/568,111.

*Primary Examiner* — Meng Vang

(57) ABSTRACT

A converged memory device includes at least a first memory and a second memory and a controller to select the first or second memory for performing fast or normal data processing, respectively, in response to a request from a host. The first memory includes a sense amplifier, one or more cell matrices, and a switching device. The cell matrices includes one or more first region memory cells disposed less than a first distance from the sense amplifier and one or more second region memory cells disposed more than a second distance from the sense amplifier, the second distance being longer than the first distance. The switching device is disposed between the first and second region memory cells. The controller controls the switching device to couple the first region memory cells to the sense amplifier and to decouple the second region memory cells from the sense amplifier according to the request.

23 Claims, 21 Drawing Sheets

(56) References Cited

U.S. PATENT DOCUMENTS

| | | | |
|---|---|---|---|
| 6,466,509 B1* | 10/2002 | Tanizaki | G11C 8/12 365/189.14 |
| 6,754,120 B1 | 6/2004 | Bellows et al. | |
| 7,808,823 B2 | 10/2010 | Ma et al. | |
| 9,305,616 B2 | 4/2016 | Yu et al. | |
| 9,633,742 B2 | 4/2017 | Desai et al. | |
| 10,453,550 B2 | 10/2019 | Won et al. | |
| 2006/0143428 A1* | 6/2006 | Noda | G06F 7/785 712/10 |
| 2007/0064489 A1* | 3/2007 | Bauser | G11C 7/14 365/185.21 |
| 2010/0325351 A1* | 12/2010 | Bennett | G06F 12/0246 711/103 |
| 2013/0286759 A1 | 10/2013 | Park et al. | |
| 2013/0311709 A1 | 11/2013 | Im et al. | |
| 2013/0329506 A1* | 12/2013 | Jeong | G11C 7/08 365/194 |
| 2017/0092366 A1* | 3/2017 | Hwang | G11C 16/10 |
| 2017/0206033 A1 | 7/2017 | Ma et al. | |
| 2017/0269989 A1 | 9/2017 | Kim | |
| 2018/0059937 A1 | 3/2018 | Kim | |

* cited by examiner

CONVERGED MEMORY DEVICE AND METHOD THEREOF

CROSS-REFERENCE TO RELATED APPLICATIONS

The present application claims priority to Korean Patent Application No. 10-2017-0149360, filed on Nov. 10, 2017, which is incorporated herein by reference in its entirety.

BACKGROUND

1. Field

Exemplary embodiments of the present disclosure relate to a converged memory device, and to a method for operating the converged memory device.

2. Description of the Related Art

Data are becoming important assets in the fourth industrial revolution, and the demands for new technology in support of transferring and analyzing large-scale data at a high data rate are increasing. For example, as artificial intelligence, autonomous driving, robotic, health care, virtual reality (VR), augmented reality (AR), and smart home technologies are spreading, demands for servers or data centers are increasing.

A legacy data center includes resources for computing, networking, and storing data, in the same equipment. However, a future large-scale data center may construct resources individually and then logically restructure the resources. For example, in the large-scale data center, the resources may be modularized at the level of racks, and the modularized resources may be restructured and supplied according to their usage. Therefore, a converged storage or memory device, which can be used for the future large-scale data center, is demanded.

SUMMARY

Embodiments of the present disclosure are directed to a converged memory device for improving a processing rate of a plurality of memories, which are included in a memory blade mounted on a server system or a data processing system, and decreasing power consumption of the plurality of memories, and a method for operating the converged memory device.

In accordance with an embodiment of the present invention, a converged memory device includes: a plurality of memories including a first memory and a second memory; and a controller configured to select the first memory for performing fast data processing in response to a request from a host and to select the second memory for performing normal data processing, a data processing rate of the normal data processing being lower than a data processing rate of the fast data processing, wherein the first memory includes: a sense amplifier; one or more cell matrices that include one or more first region memory cells that are disposed less than a first distance from the sense amplifier and one or more second region memory cells that are disposed more than a second distance from the sense amplifier, the second distance being longer than the first distance; and a switching device disposed between the first region memory cells and the second region memory cells, and wherein the controller controls the switching device to couple the first region memory cells to the sense amplifier and to decouple the second region memory cells from the sense amplifier in response to the request.

At least one memory of the plurality of memories may include a dynamic random access memory (DRAM).

The number of the first region memory cells is equal to the number of the second region memory cells.

The number of the first region memory cells is different from the number of the second region memory cells.

The first memory may further include: an output unit configured to sequentially output data from the first region memory cells and data from the second region memory cells through a data path, and to output the data from the first region memory cells before the data is received from the second region memory cells.

The first memory may further include: a first amplifier configured to receive and amplify the data from the first region memory cells and to output the amplified data to the output unit; and a second amplifier configured to receive and amplify the data from the second region memory cells and to output the amplified data to the output unit.

The controller may copy predetermined data among the data of the second region memory cells into the first region memory cells, and when the predetermined data is requested, the controller accesses data stored in the first region memory cells that corresponds to the predetermined data.

The predetermined data may include data of a monitored memory cell that is frequently used data.

The request may include a request corresponding to fast data processing or lower power consumption.

In accordance with another embodiment of the present invention, A method of operating a converged memory device that includes a memory including a sense amplifier and a cell matrix, the method may include: receiving a request from a host; and controlling a switching device disposed between one or more first region memory cells and one or more second region memory cells in order to decouple the second region memory cells from the sense amplifier in response to the request, wherein the switching device, the first region memory cells, and the second region memory cells are included in the cell matrix, the first region memory cells being disposed less than a first distance from the sense amplifier, the second region memory cells being disposed more than a second distance from the sense amplifier, the second distance being longer than the first distance.

At least one memory of the plurality of memories may include a dynamic random access memory (DRAM).

The number of the first region memory cells is different from the number of the second region memory cells.

The number of the first region memory cells and the number of the second region memory cells may be different from each other.

The method may further include: sequentially outputting data from the first region memory cells and data from the second region memory cells through a data path, wherein the data from the first region memory cells are outputted before the data from the second region memory cells is received.

The method may further include: copying predetermined data among the data of the second region memory cells into the first region memory cells, and when the predetermined data is requested, accessing data stored in the first region memory cells that corresponds to the predetermined data.

The predetermined data includes data of a monitored memory cell that is frequently used data.

The request includes a request corresponding to fast data processing or lower power consumption.

In accordance with yet another embodiment of the present invention, a memory device includes: a plurality of cell matrices that includes a plurality of memory cells that are disposed between a plurality of word lines and a plurality of bit lines; and a plurality of sense amplifiers that are disposed between the cell matrices, wherein at least one cell matrix among the cell matrices includes: one or more first region memory cells disposed less than a first distance from a sense amplifier; one or more second region memory cells disposed more than a second distance from the sense amplifier, the second distance being longer than the first distance; and switching devices disposed between the first region memory cells and the second region memory cells, the switching devices being controlled to couple the first region memory cells to the sense amplifier and decouple the second region memory cells from the sense amplifier.

The bit lines are coupled to the sense amplifiers to have an asymmetrical structure.

The number of the first region memory cells is equal to the number of the second region memory cells.

The number of the first region memory cells is different from the number of the second region memory cells.

The memory device may further include: an output unit configured to sequentially output data from the first region memory cells and data from the second region memory cells through a data path, and to output the data from the first region memory cells before receiving of the data from the second region memory cells is completed.

The memory device may further include: a first amplifier configured to receive and amplify the data from the first region memory cells and to output the amplified data to the output unit; and a second amplifier configured to receive and amplify the data from the second region memory cells and to output the amplified data to the output unit.

DETAILED DESCRIPTION

Figure 1:
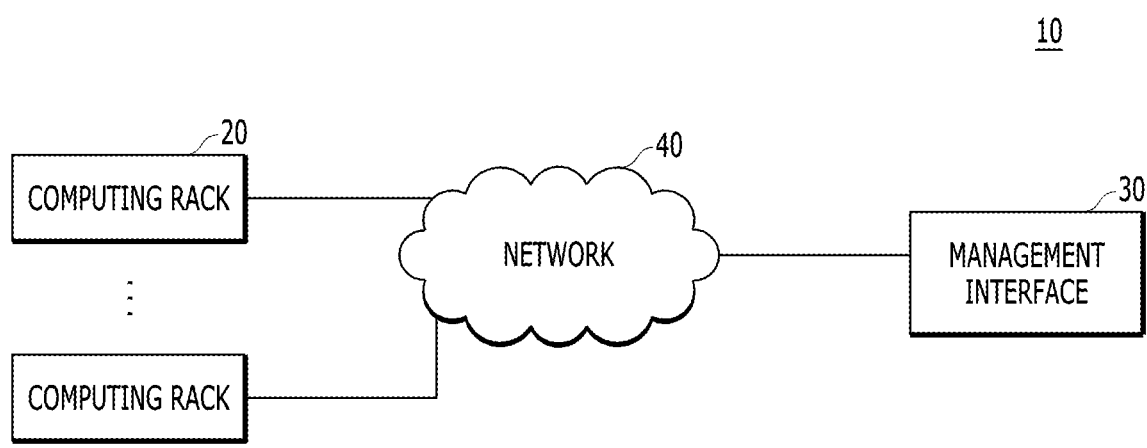
FIG. 1 is a block diagram illustrating a data processing system.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments.

FIG. 1 is a block diagram illustrating a data processing system 10. Referring to FIG. 1, the data processing system 10 may include a plurality of computing racks 20, a management interface 30, and a network 40 for communication between the computing racks 20 and the management interface 30. The data processing system 10 having this rack-scale architecture may be used by a data center for processing large-scale data.

Each of the computing racks 20 may individually implement one computing device. Alternatively, each of the computing racks 20 may be combined with other computing racks to implement one computing device. The specific structures and operations of the computing racks 20 will be described later on.

The management interface 30 may provide an interactive interface for a user to control, administrate or manage the data processing system 10. The management interface 30 may be realized using an arbitrary type of a computing device that includes any of a computer, a multi-processor system, a server, a rack-mount server, a blade server, a lap-top computer, a notebook computer, a tablet computer, a wearable computing device, a network device, a web device, a distributed computing system, a processor-based system, a consumer electronic device, and so on.

According to some embodiments of the present disclosure, the management interface 30 may be realized by a distributed system having operation functions which may be performed by the computing racks 20 or having user interface functions which may be performed by the management interface 30. According to other embodiments of the present disclosure, the management interface 30 may be realized by a virtual cloud server that includes multi-computing devices distributed through the network 40. The management interface 30 may include a processor, an input/output subsystem, a memory, a data storage device, and a communication circuit.

The network 40 may transfer/receive data between the computing racks 20 and the management interface 30 and/or between the computing racks 20. The network 40 may be realized by an appropriate number of various wired and/or wireless networks. For example, the network 40 may include a publicly accessible global network, such as a wired or wireless Local Area Network (LAN), a Wide Area Network (WAN), a cellular network, and/or the Internet. In addition, the network 40 may include an appropriate number of auxiliary network devices, such as auxiliary computers, routers, and switches.

Figure 2:
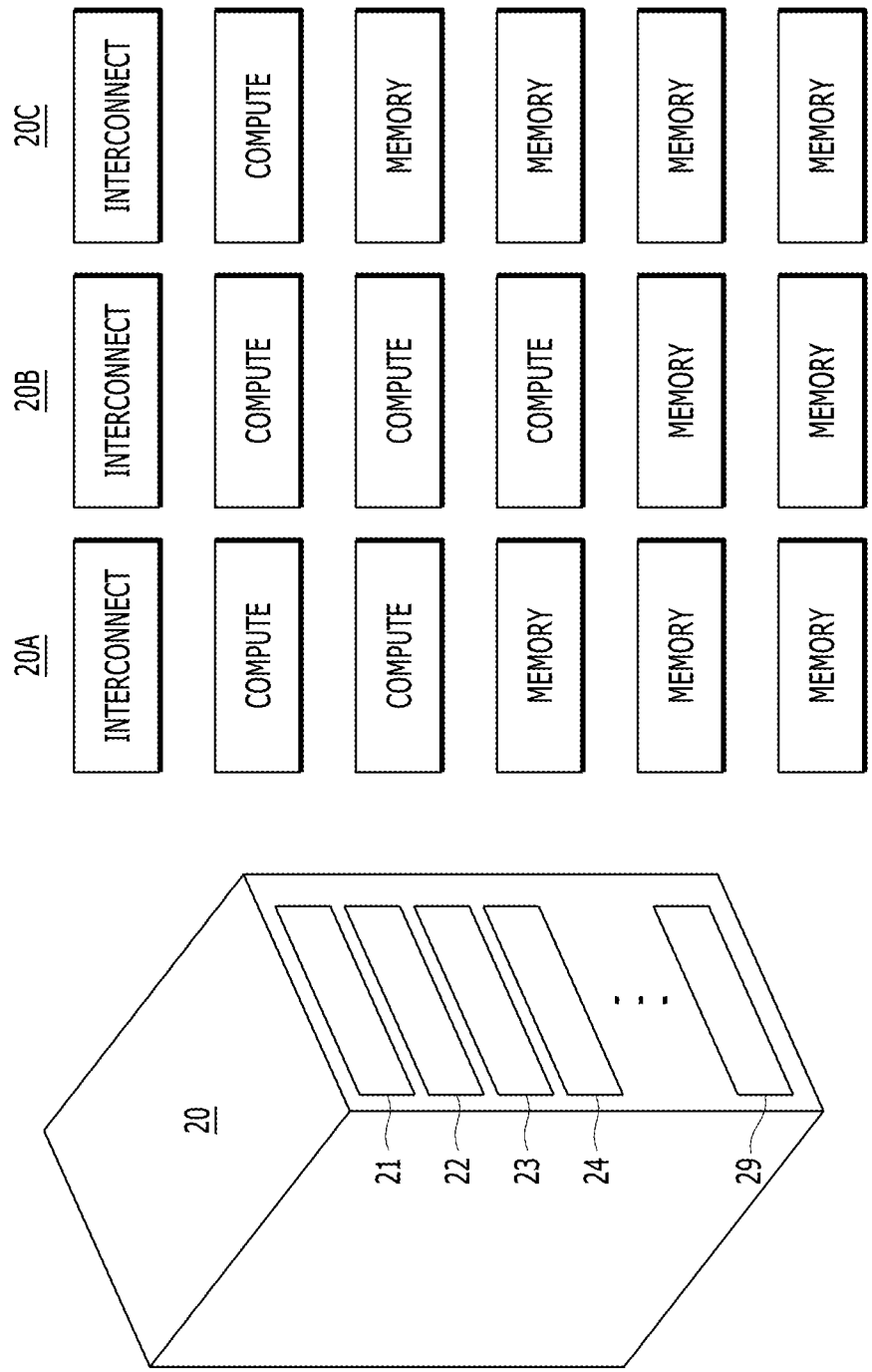
FIGS. 2 and 3 illustrate a computing device in accordance with an embodiment of the present disclosure.

FIG. 2 illustrates a computing device having a rack structure in accordance with an embodiment of the present disclosure.

Referring to FIG. 2, a computing rack 20 may include constituent elements in various forms, and structures, shapes, and names of the constituent elements are not limited. For example, the computing rack 20 may include a plurality of drawers 21 to 29. Each of the drawers 21 to 29 may include a plurality of modules, each of which may include a plurality of blades.

In various embodiments of the present disclosure, the computing rack 20 may be realized by a combination of appropriate numbers of compute blades, memory blades, and/or interconnect blades. Herein, it is defined that the computing rack 20 is realized by a combination of a plurality of blades, but the computing rack 20 may also be realized by diversely named elements such as drawers, modules, trays, boards, sashes, or units. The computing rack 20 may have a structure where the constituent elements of the computing rack 20 are disaggregated and classified according to their functions for the sake of convenience in realization. Although not limited, the computing rack 20 may have a structure of an interconnect blade, a compute blade, and a memory blade in a classification order from the top. The computing rack 20 and a computing device including the computing rack 20 may be referred to as 'a rack-scale system' or 'a disaggregated system.'

In an embodiment of the present disclosure, a computing device may be realized by one computing rack 20. In other embodiments, the computing device may be realized by all constituent elements of two or more computing racks 20, realized by some of constituent elements of two or more computing racks 20, or some of constituent elements of one computing rack 20.

In various embodiments of the present disclosure, a computing device may be realized by a combination of appropriate numbers of compute blades, memory blades, and interconnect blades that are included in the computing rack 20. As illustrated in FIG. 2, a computing rack 20A may include two compute blades, three memory blades, and one interconnect blade. A computing rack 20B may include three compute blades, two memory blades, and one interconnect blade. A computing rack 20C may include one compute blade, four memory blades, and one interconnect blade.

Although FIG. 2 illustrates a case where the computing rack 20 is realized by appropriate numbers of compute blades, memory blades, and interconnect blades, the computing rack 20 may include additional constituent elements that may be included in typical servers, such as a power system, a cooling system, an input/output device, and so on.

Figure 3:
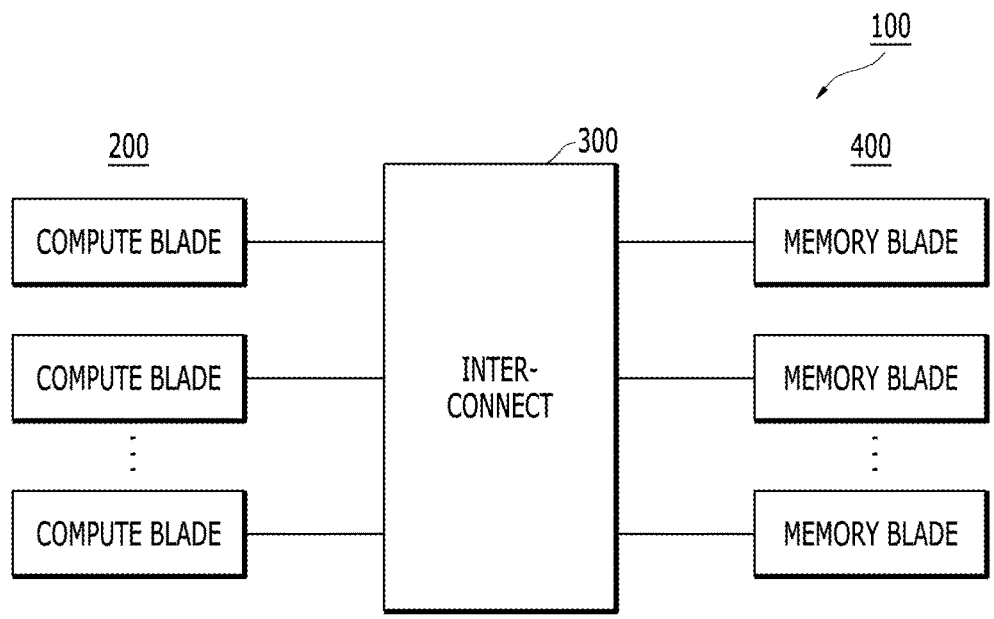

FIG. 3 illustrates a computing device 100 in accordance with an embodiment of the present disclosure.

Referring to FIG. 3, the computing device 100 may include a plurality of compute blades 200, a plurality of memory blades 400, and an interconnect blade 300. The compute blades 200 may be called pooled compute blades or pooled compute systems. Similarly, the memory blades may be called pooled memory blades or pooled memory systems.

Herein, it is defined that the computing device 100 is realized by a combination of a plurality of blades, but the computing device 100 may also be realized by diversely named elements such as drawers, modules, trays, boards, sashes, or units.

Each of the compute blades 200 may include one or more of processing elements such as a processor, a processing/control circuit, a Central Processing Unit (CPU), and so on.

Each of the memory blades 400 may include one or more memories, such as volatile memories, non-volatile memories, or a combination thereof. For example, each of the memory blades 400 may include Dynamic Random Access Memories (DRAMs), flash memories, memory cards, hard disk drives (HDDs), solid state drives (SSDs), or a combination thereof.

Each of the memory blades 400 may be divided, allocated, or designated by and used by one or more processing elements that are included in each of the compute blades 200. Also, each of the memory blades 400 may store one or more operating systems (OS) that may be initialized and/or executed by the compute blades 200.

The interconnect blade 300 may include a communication circuit, a communication device, or a combination thereof, which may be divided, allocated, or designated by and used by one or more processing elements included in each of the compute blades 200. For example, the interconnect blade 300 may be realized by an arbitrary number of network interface ports, interface cards, or interface switches. The interconnect blade 300 may use protocols related to one or more wired communication technologies for communication. For example, the interconnect blade 300 may support communication between the compute blades 200 and the memory blades 400 based on one or more of protocols such as PCIe (Peripheral Component Interconnect Express), QPI (QuickPath Interconnect), Ethernet, and the like.

Figure 4:
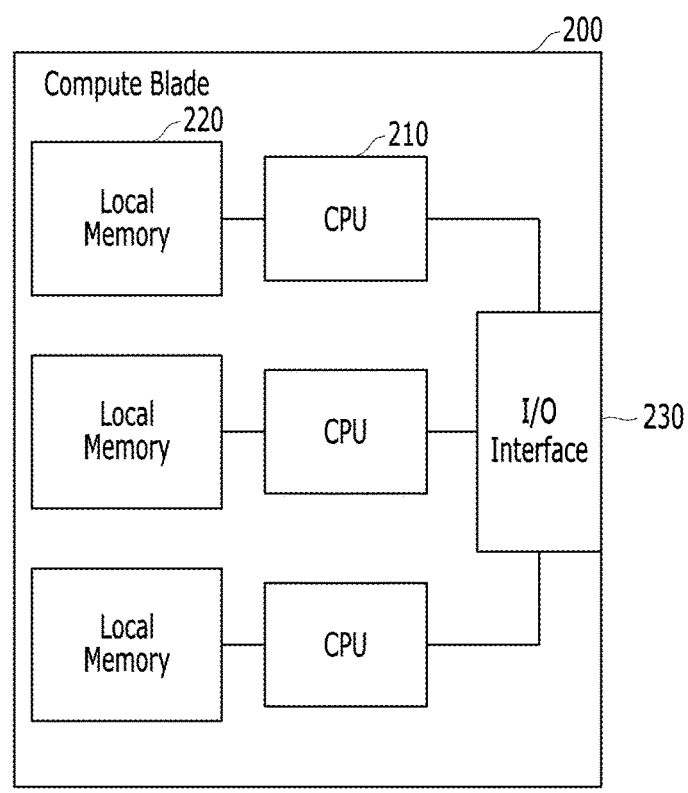
FIG. 4 is a block diagram illustrating a compute blade in accordance with an embodiment of the present disclosure.

FIG. 4 is a block diagram illustrating a compute blade 200 in accordance with an embodiment of the present disclosure.

Referring to FIG. 4, the compute blade 200 may include one or more Central Processing Units (CPUs) 210, one or more local memories 220, and an input/output (I/O) interface 230.

The CPUs 210 may divide, allocate, or designate one or more memory blades to be used, among the memory blades 400 illustrated in FIG. 3. Also, the CPUs 210 may initialize the one or more memory blades, and perform a data read operation and/or a data write (i.e., program) operation on the one or more memory blades.

The local memories 220 may store data to perform an operation of the CPUs 210. In various embodiments of the present disclosure, the local memories 220 may be in a one-to-one correspondence with the CPUs 210.

The input/output interface 230 may support interfacing between the CPUs 210 and the memory blades 400 through the interconnect blade 300 of FIG. 3. The input/output interface 230 may use protocols related to one or more wired communication technologies, output and transfer data from the CPUs 210 to the interconnect blade 300, and receive data inputted from the interconnection blade 300 to the CPUs 210. For example, the input/output interface 230 may support communication between the CPUs 210 and the interconnect blade 300 using one or more of protocols such as PCIe (Peripheral Component Interconnect Express), QPI (QuickPath Interconnect), Ethernet, and the like.

Figure 5A:
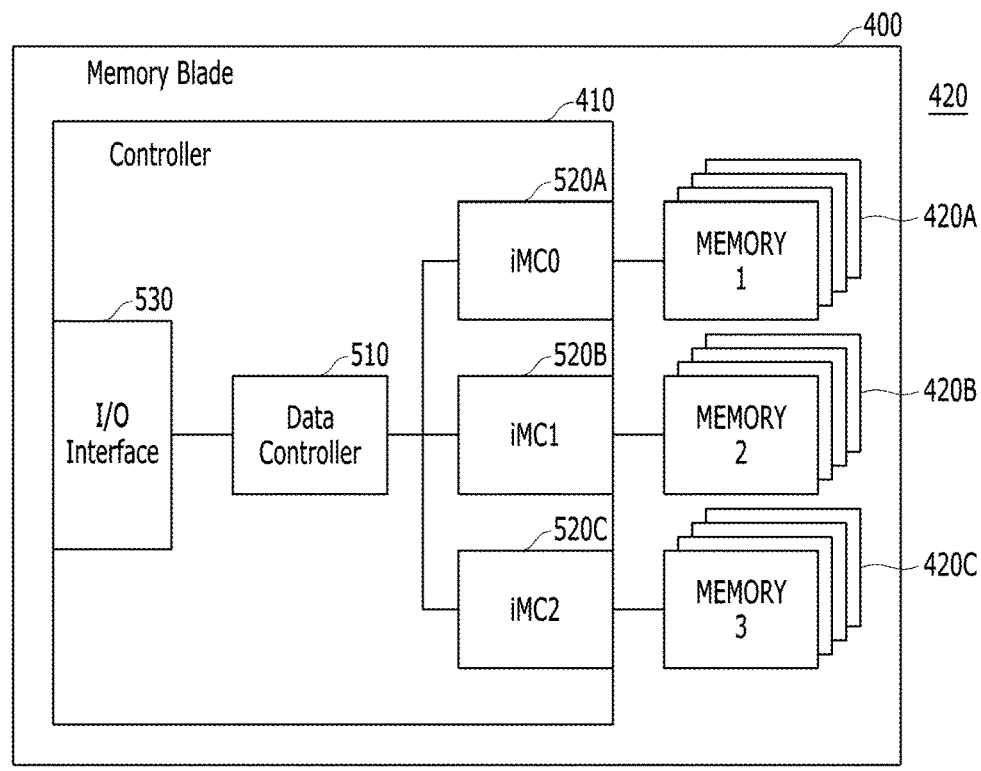
FIGS. 5A and 5B are block diagrams illustrating memory blades in accordance with embodiments of the present disclosure.
Figure 5B:
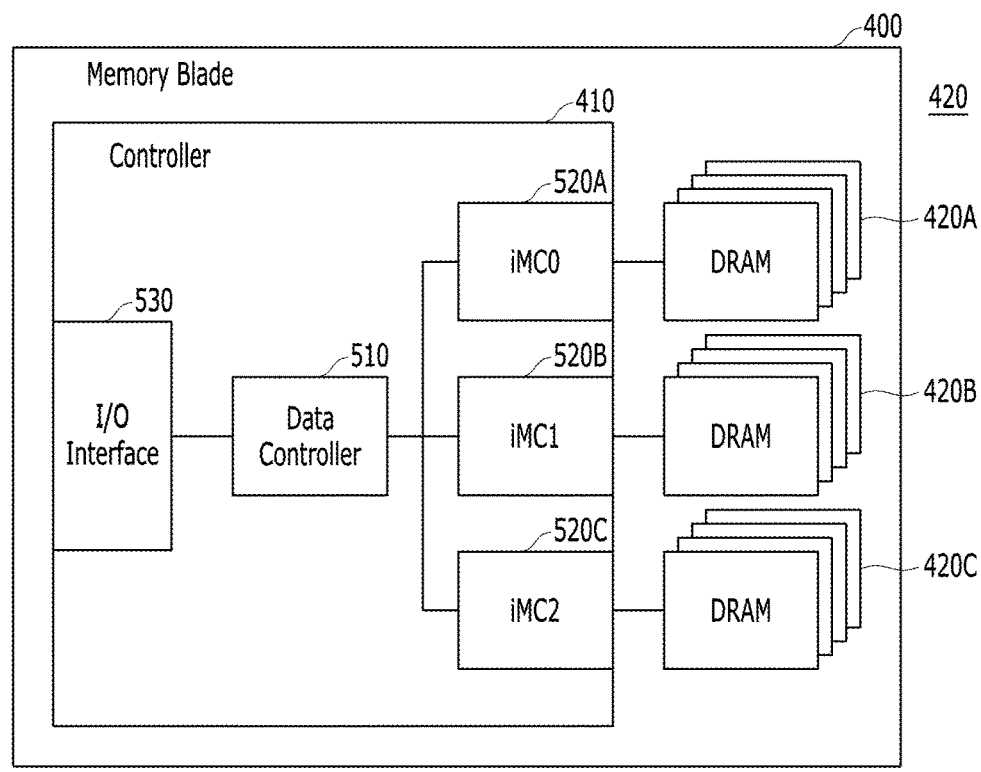

FIGS. 5A and 5B are block diagrams illustrating memory blades in accordance with embodiments of the present disclosure.

Referring to FIG. 5A, a memory blade 400 may include a controller 410 and a plurality of memories 420. The memories 420 may store (or write) data therein and output (or read out) stored data under the control of the controller 410. The memories 420 may include a first memory group 420A, a second memory group 420B, and a third memory group 420C. Each of the first, second, and third memory groups 420A, 420B, and 420C may include a multiplicity of memories. The first memory group 420A, the second memory group 420B, and the third memory group 420C may have the same characteristics or different characteristics. According to various embodiments of the present disclosure, the first memory group 420A, the second memory group 420B, and the third memory group 420C may include memories having the same characteristics in terms of storage capacity or latency, or memories having different characteristics.

Referring to FIG. 5B, each of the first memory group 420A, the second memory group 420B, and the third memory group 420C may include Dynamic Random Access Memories (DRAMs).

Referring back to FIG. 5A, the controller 410 may include a data controller 510, memory controllers MC 520A to 520C, and an input/output (I/O) interface 530.

The data controller 510 may control data that are transferred/received between the memories 420 and the compute blades 200 of FIG. 3. For example, in response to a write request or command, the data controller 510 may receive data for a write operation from the compute blades 200, and control the write operation for writing the data in a corresponding memory among the memories 420. In a read operation, in response to a read request or command, the data controller 510 may read out data stored in a particular memory among the memories 420 and control the read operation for outputting the read data to a corresponding compute blade among the compute blades 200.

The memory controllers MC 520A to 520C may be disposed between the data controller 510 and the memories 420, and support interfacing between the data controller 510 and the memories 420. The memory controllers MC 520A to 520C may include a first memory controller iMC0 520A, a second memory controller iMC1 520B, and a third memory controller iMC2 520C that respectively correspond to the first memory group 420A, the second memory group 420B, and the third memory group 420C that are included in the memories 420. The first memory controller iMC0 520A may be disposed between the data controller 510 and the first memory group 420A and support a data transfer/reception between the data controller 510 and the first memory group 420A. The second memory controller iMC1 520B may be disposed between the data controller 510 and the second memory group 420B and support a data transfer/reception between the data controller 510 and the second memory group 420B. The third memory controller iMC2 520C may be disposed between the data controller 510 and the third memory group 420C and support a data transfer/reception between the data controller 510 and the third memory group 420C. Herein, although a case where the controller 410 includes three memory controllers, i.e., the first memory controller iMC0 520A, the second memory controller iMC1 520B, and the third memory controller iMC2 520C is illustrated, when the first memory group 420A, the second memory group 420B, and the third memory group 420C include Dynamic Random Access Memories (DRAMs) as illustrated in FIG. 5B, the controller 410 may include a single memory controller.

The input/output interface 530 may support interfacing between the data controller 510 and the compute blades 200 through the interconnect blade 300 of FIG. 3. The input/output interface 530 may use one or more protocols related to wired communication technologies, transfer read data from the data controller 510 to the interconnect blade 300, and transfer write data from the interconnect blade 300 to the data controller 510. For example, the input/output interface 530 may support communication between the data controller 510 and the interconnect blade 300 based on one or more of protocols such as Peripheral Component Interconnect Express (PCIe), QuickPath Interconnect (QPI), Ethernet, and the like.

As described above, a data processing system or a server system may have a structure in which a plurality of blades, e.g., compute blades and memory or storage blades, are discriminatively installed in a unit rack. Herein, one memory blade may be a converged memory device or a pooled memory in which the same or different memories are converged according to required characteristics. For example, a memory blade requiring fast data processing may include a plurality of DRAMs. The following embodiments of the present disclosure suggest a method of allocating memories appropriate for a request in order to improve memory characteristics in terms of a speed and a power in a system including a converged memory device.

In other words, in a server system or a data processing system, a memory resource request occurs according to various applications or users' requirements, and memories are allocated appropriately according to the request. Therefore, memory devices should optimize functions and operation conditions for the memory allocation. In short, it is required to change and optimize characteristics of memories, such as a memory capacity, an operation rate, and power consumption. The following embodiments of the present disclosure suggest a method of dynamically operating memories included in a converged memory device as a fast memory or a normal memory according to a request. For example, when the memories are Dynamic Random Access Memories (DRAMs), memory cells included in the DRAMs may operate dynamically by being classified into fast memory cells or normal memory cells. An operation of classifying the memory cells into fast memory cells or normal memory cells may be performed by controlling bit lines using switching devices. According to various embodiments of the present disclosure, the switching devices may be disposed appropriately in the memories according to a required operation rate and power consumption. In addition, cloning cells may be used. According to various embodiments of the present disclosure, it is possible to efficiently cope with various applications by dynamically operating the memories included in the converged memory device as fast memories or normal memories. Also, embodiments of the present disclosure may improve an operation rate and power consumption of the converged memory device. Also, embodiments of the present disclosure may improve system performance by dynamically operating allocated memories according to a request, rather than by allocating new memories.

Figure 6A:
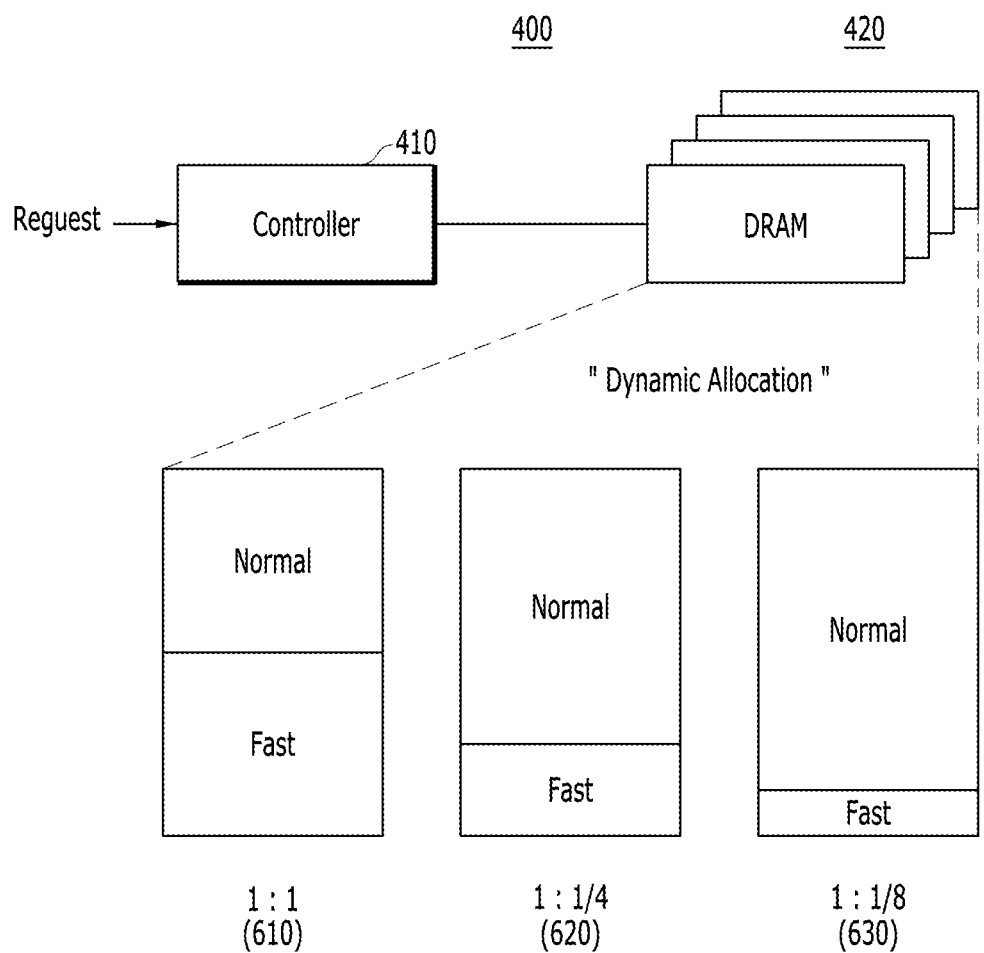
FIG. 6A illustrates a memory blade including a controller in accordance with an embodiment of the present disclosure.

FIG. 6A illustrates a memory blade including a controller in accordance with an embodiment of the present disclosure.

Referring to FIG. 6A, a memory blade 400 may include a controller 410 and memories 420. According to various embodiments of the present disclosure, each of the memories 420 may be a DRAM. The controller 410 may receive a request from one compute blade among the compute blades 200 illustrated in FIG. 3, select a memory from the memories 420, and allocate the selected memory to process the received request. The controller 410 may allocate the memories 420 in order to improve a processing rate of the DRAMs and to reduce power consumption. The power consumption includes power consumption during a refresh operation of the DRAMs.

According to various embodiments of the present disclosure, the controller 410 may select and allocate some of DRAMs among the memories 420 as fast DRAMs for processing data at a high speed, and select and allocate the other DRAMs among the memories 420 as normal DRAMs for processing data at a normal speed. In an embodiment, the controller 410 may allocate the DRAMs 420 so that the number of normal DRAMs and the number of fast DRAMs become the same in step 610. For example, a ratio of the number of normal DRAMs to the number of fast DRAMs is 1:1 when step 610 is complete. In another embodiment, the controller 410 may allocate the DRAMs 420 so that the number of normal DRAMs and the number of fast DRAMs are different. For example, in step 620, the controller 410 may allocate the DRAMs 420 so that a ratio of the number of normal DRAMs to the number of fast DRAMs is 1:¼, or in step 630, the controller 410 may allocate the DRAMs 420 so that a ratio of the number of normal DRAMs to the number of fast DRAMs is 1:⅛. According to various embodiments of the present disclosure, the controller 410 may dynamically select and allocate fast DRAMs and normal DRAMs among the DRAMs 420 according to the received request. In other words, instead of allocating the DRAMs 420 into a fixed number of fast DRAMs and a fixed number of normal DRAMs, the controller 410 may allocate the DRAMs 420 in such a manner that the number of allocated fast DRAMs is increased when the received request requires fast processing and low power consumption. When the request is not received, or specifies other requirements, the controller 410 may allocate the DRAMs 420 in such a manner that the number of allocated fast DRAMs is decreased or becomes zero (0).

Figure 6B:
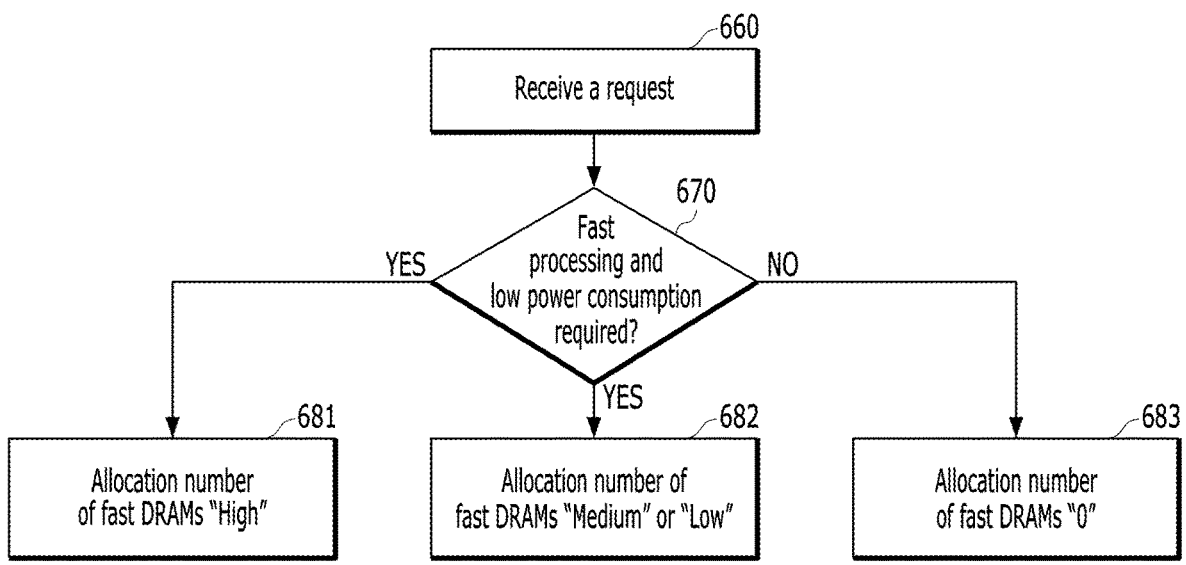
FIG. 6B is a flowchart illustrating performing an allocation operation of allocating a plurality of memories that are included in a memory blade by a controller in accordance with an embodiment of the present disclosure.

FIG. 6B is a flowchart illustrating an operation of allocating memories in a memory blade in accordance with an embodiment of the present disclosure. For example, the controller 410 illustrated in FIG. 6A may dynamically allocate the DRAMs 420 included in the memory blade 400 as fast DRAMs and normal DRAMs.

Referring to FIG. 6B, the controller 410 may receive a request in step 660, and determine whether the received request requires fast processing and low power consumption or not in step 670. According to various embodiments of the present disclosure, the request may be a request from a processing element included in one compute blade among the compute blades 200 illustrated in FIG. 3. In another embodiment, the request may be a request from a single host. Since the host may include a single compute blade or a plurality of compute blades, for the sake of convenience in description, the present disclosure will be described hereafter based on an assumption that the request is from the host.

When it is determined that the received request requires fast processing and low power consumption, the controller 410 may select and allocate fast DRAMs for processing the received request at a high speed among the DRAMs 420 in steps 681 and 682. According to required extents of fast processing and low power consumption, the controller 410 may allocate the fast DRAMs in such a manner that the number of fast DRAMs becomes 'high' in the step 681, or allocate the fast DRAMs in such a manner that the number of fast DRAMs becomes 'medium' or 'low' in the step 682.

When it is determined that the received request does not require fast processing and low power consumption, the controller 410 may select and allocate normal DRAMs for processing the received request among the DRAMs 420 in steps 683. In other words, in this case, the controller 410 may not allocate fast DRAMs. Thus, the number of fast DRAMs allocated becomes zero (0).

As described above, FIG. 6B illustrates an embodiment in which the cases requiring fast data processing and low power consumption are divided into three cases of 'high,' 'medium,' and 'low.' The controller 410 allocates a different number of fast DRAMs in each of the three cases. However, embodiments are not limited thereto. The number of cases requiring fast data processing and low power consumption may be appropriately adjusted and the number of fast DRAMs allocated to each of the cases may be changed according to the number of cases, for example.

Figure 7A:
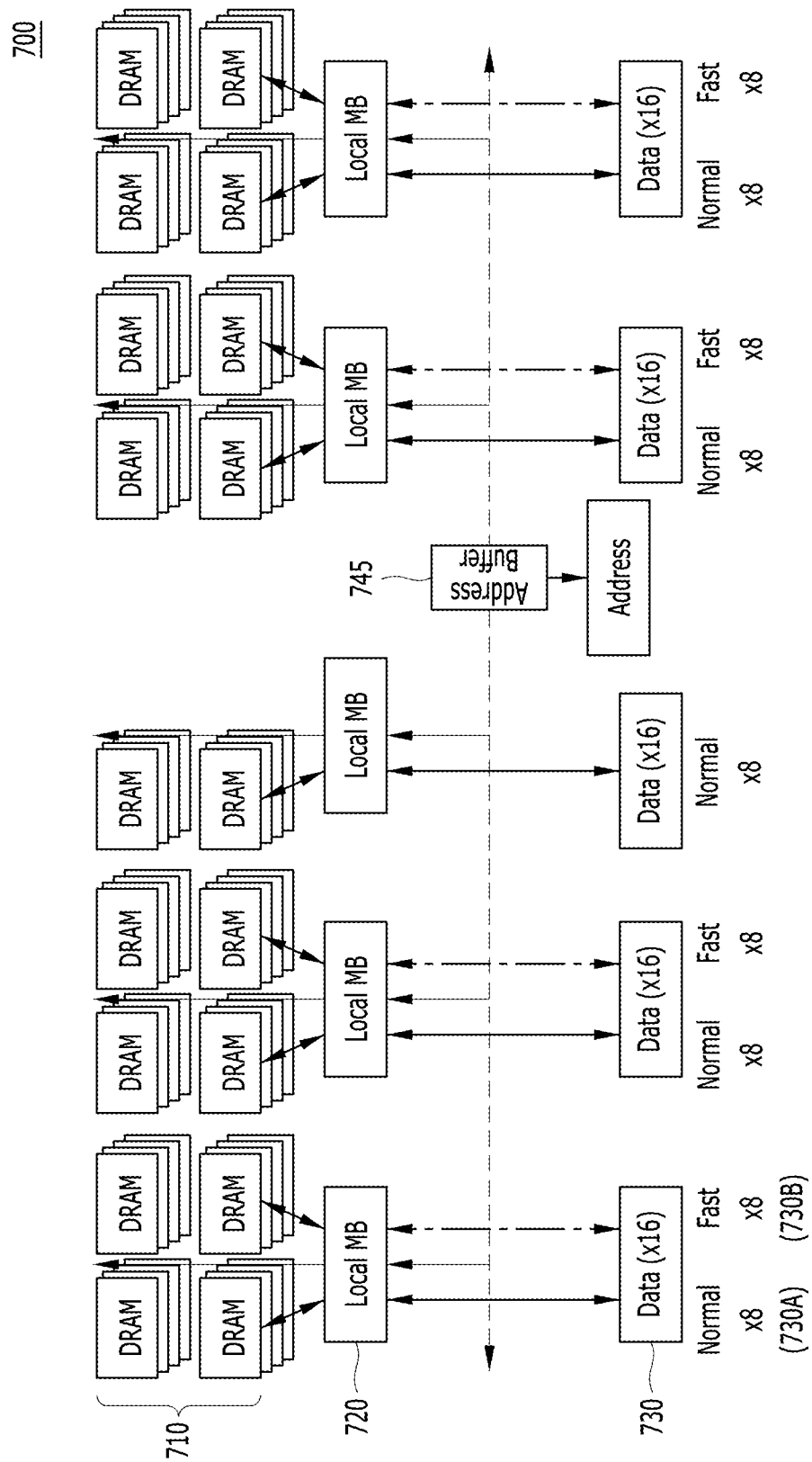
FIGS. 7A to 7C illustrate a memory blade that uses a portion of a plurality of memories for fast data processing and that uses the other portion of the memories for normal data processing in accordance with an embodiment of the present disclosure.
Figure 7B:
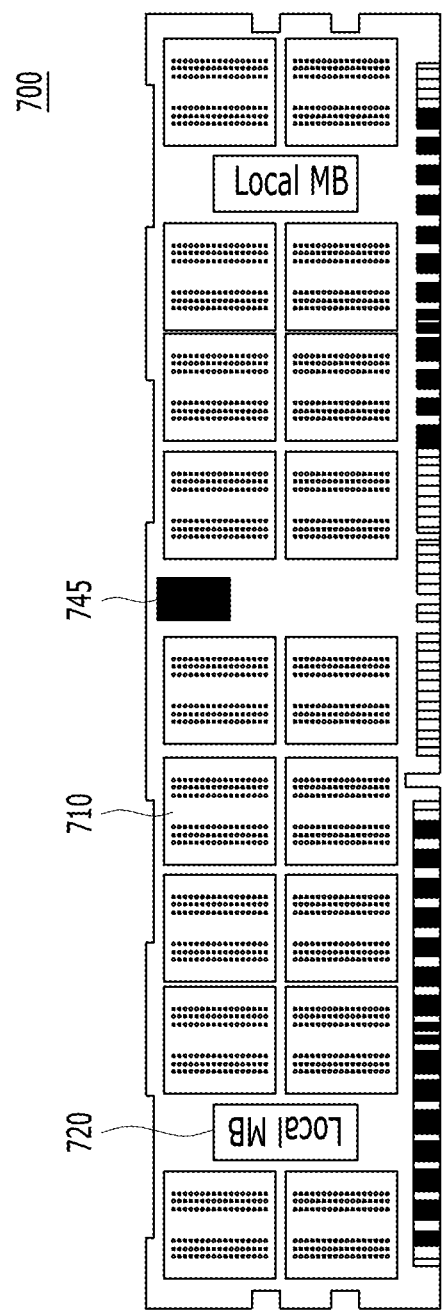
Figure 7C:
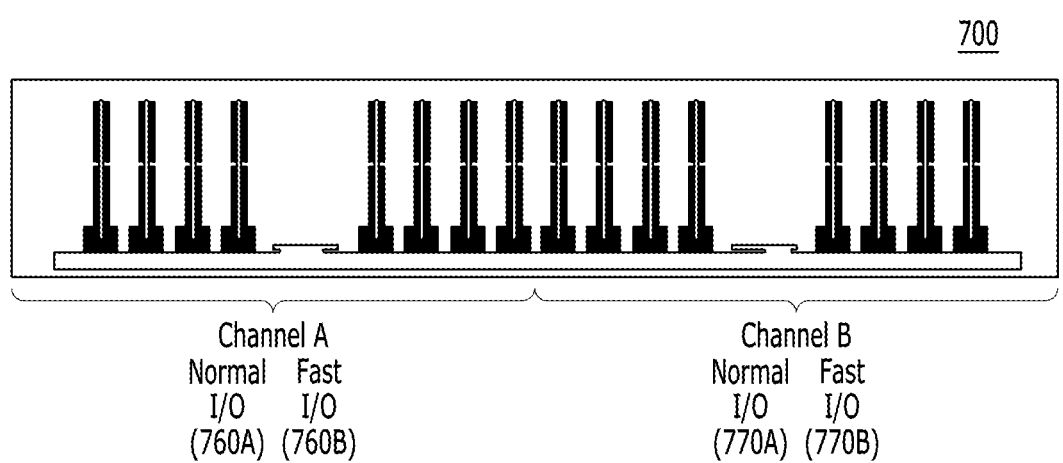

FIGS. 7A to 7C illustrate a memory blade 700, which uses a first memory group of a plurality of memories for fast data processing and uses a second memory group of the plurality of memories for normal data processing, in accordance with an embodiment of the present disclosure. Although a structure in which the plurality of memories are included in one memory blade 700 is used as an example herein, the plurality of memories may be included in one memory module, drawer, or rack unit in other examples of the present disclosure.

Referring to FIGS. 7A and 7B, the memory blade 700 may include a plurality of DRAMs 710. The DRAMs 710 may be divided by a controller, e.g., the controller 410 in FIG. 6A, into normal DRAMs and fast DRAMs, as described above with reference to FIGS. 6A and 6B. Data 730 may be divided into normal data 730A and fast data 730B. The normal data 730A are transferred/received between a normal DRAM and a data path (not shown), and the fast data 730B are transferred/received between a fast DRAM and the data path. In other words, the DRAMs 710 may output normal data or fast data. The memory blade 700 may further include a local memory buffer (MB) 720 and an address buffer 745. The local memory buffer 720 temporarily stores data that are transferred/received between the DRAMs 710 and the data path, and the address buffer 745 stores an address to be applied to the local memory buffer 720.

Referring to FIG. 7C, the memory blade 700 may be combined with a host processor, e.g., the compute blade 200 of FIG. 3, through a plurality of channels, e.g., a channel A and a channel B. The channel A may include a path 760A for normal data input/output (I/O) and a path 760B for fast data input/output (I/O). Likewise, the channel B may include a path 770A for normal data input/output (I/O) and a path 770B for fast data input/output (I/O).

According to the embodiments of the present disclosure described above, DRAMs in a memory blade may dynamically perform normal data output or fast data output according to a request. Therefore, the embodiments of the present disclosure may be able to improve an operation rate and system performance by selecting and allocating appropriate DRAMs, which are appropriate for processing an urgent request that should be processed rapidly and that outputs fast data. Also, the embodiments of the present disclosure may be able to detect refresh characteristics of DRAMs and appropriately use them according to a request. DRAMs for outputting fast data may be selected and allocated by providing DRAMs with a bit line switching device and controlling the bit line switching device, which will be described below.

Figure 8A:
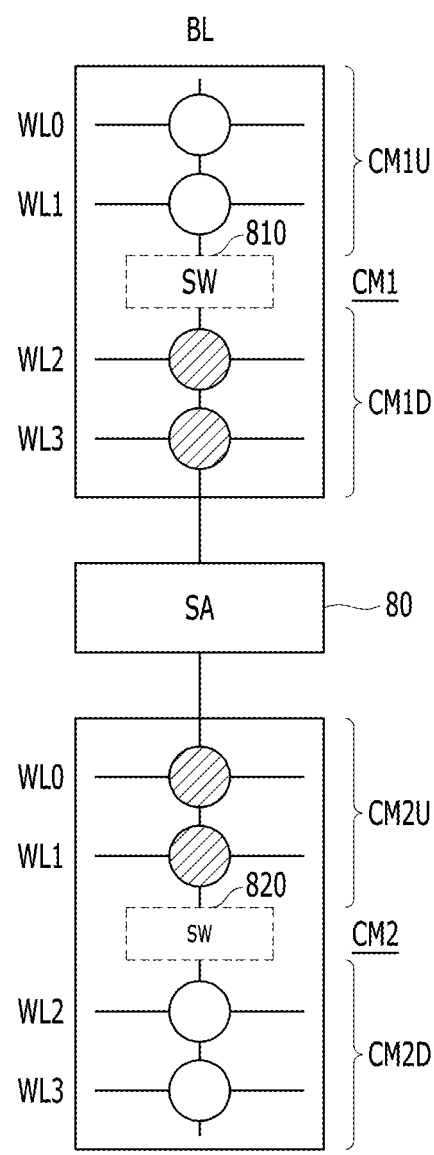
FIGS. 8A and 8B illustrate Dynamic Random Access Memories (DRAMs) that are used for fast data processing, among a plurality of memories, in accordance with embodiments of the present disclosure.
Figure 8B:
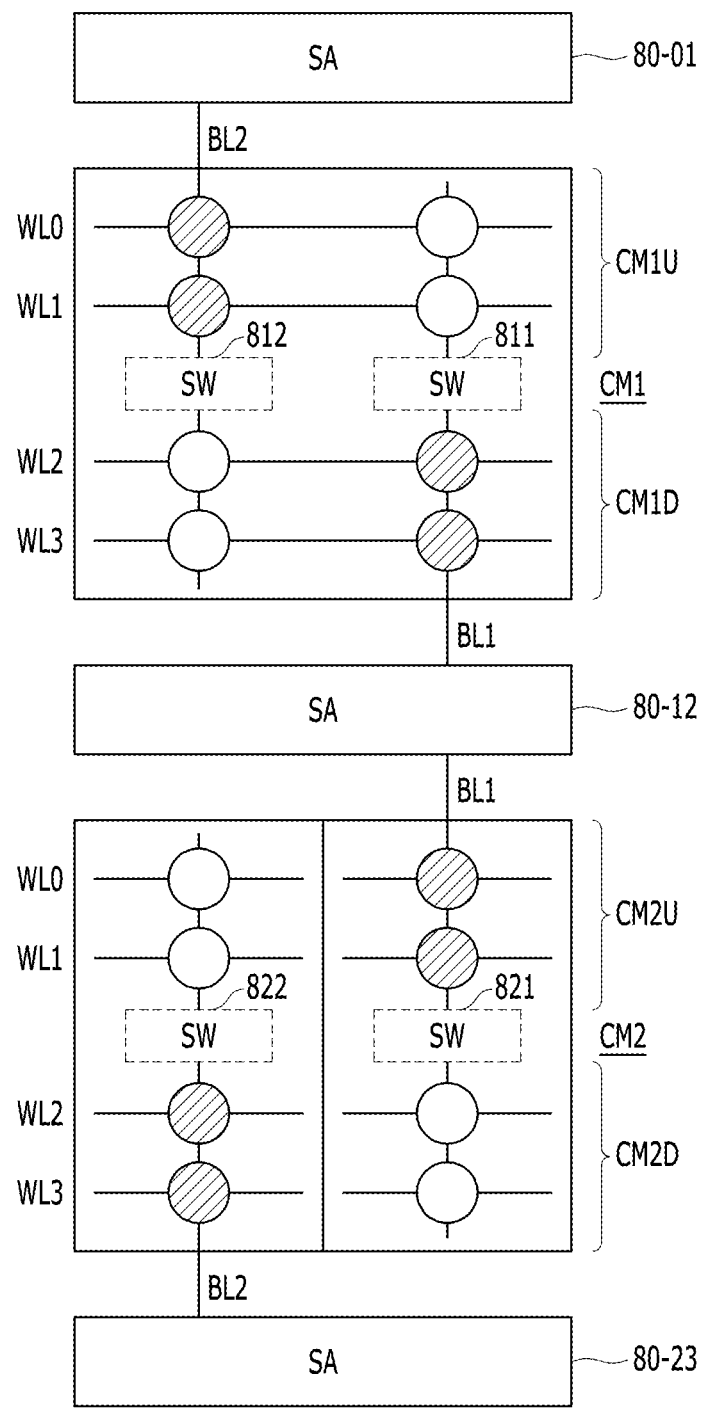

FIGS. 8A and 8B illustrate a Dynamic Random Access Memory (DRAM) that is used for fast data processing among a plurality of memories in accordance with embodiments of the present disclosure. For the sake of convenience in description, FIG. 8A illustrates a single bit line that is combined with a sense amplifier (SA) included in a DRAM. FIG. 8B illustrates a pair of bit lines that are combined with a sense amplifier (SA) in a DRAM, which has an asymmetric bit line architecture.

Referring to FIG. 8A, a DRAM may include a first cell matrix CM1, a second cell matrix CM2, and a sense amplifier (SA) 80. The sense amplifier 80 is disposed between the first cell matrix CM1 and the second cell matrix CM2. Memory cells of the first cell matrix CM1, the sense amplifier 80, and memory cells of the second cell matrix CM2 may be coupled to a single bit line BL.

In the first cell matrix CM1, the memory cells are coupled between the bit line BL and a plurality of word lines WL0 to WL3, respectively. The memory cells included in the first cell matrix CM1 may be divided into lower memory cells CM1D and upper memory cells CM1U. The lower memory cells CM1D are disposed at positions that are less than a first distance from the sense amplifier 80 and are relatively close to the sense amplifier 80, and the upper memory cells CM1U are disposed at positions that are more than a second distance from the sense amplifier 80 and are relatively far from the sense amplifier 80. The second distance is longer than the first distance. A switching device SW 810 may be disposed between the upper memory cells CM1U and the lower memory cells CM1D. The switching device SW 810 may be turned on or off by the controller 410 shown in FIG. 6A.

When the switching device SW 810 is turned on, the upper memory cells CM1U and the lower memory cells CM1D are coupled to each other, and the memory cells CM1U and CM1D of the first cell matrix CM1 may operate as normal memory cells. On the other hand, when the switching device SW 810 is turned off, the upper memory cells CM1U are cut off from the lower memory cells CM1D, and the first cell matrix CM1 may operate as fast memory cells. When the upper memory cells CM1U are cut off from the lower memory cells CM1D, the bit line BL may not bear any load from the upper memory cells CM1U. Therefore, a data processing rate for the lower memory cells CM1D may increase and an operation current or power consumption of the first cell matrix CM1 may be reduced. As a result, when the switching device SW 810 is turned off, the first cell matrix CM1 may be able to operate as fast memory cells.

In the second cell matrix CM2, the memory cells are coupled between the bit line BL and the word lines WL0 to WL3, respectively. The memory cells in the second cell matrix CM2 may be divided into lower memory cells CM2D and upper memory cells CM2U. The lower memory cells CM2D are disposed at positions that are more than the second distance from the sense amplifier 80 and are relatively far from the sense amplifier 80. The upper memory cells CM2U are disposed at positions that are less than the first distance from the sense amplifier 80 and are relatively close to the sense amplifier 80. A switching device SW 820 may be disposed between the upper memory cells CM2U and the lower memory cells CM2D. The switching device SW 820 may be turned on or off by the controller 410 shown in FIG. 6A.

When the switching device SW 820 is turned on, the upper memory cells CM2U and the lower memory cells CM2D are coupled to each other, and the memory cells CM2U and CM2D of the second cell matrix CM2 may operate as normal memory cells. On the other hand, when the switching device SW 820 is turned off, the lower memory cells CM2D are cut off from the upper memory cells CM2U, and the second cell matrix CM2 may operate as fast memory cells. When the lower memory cells CM2D are cut off from the upper memory cells CM2U, the bit line BL may not bear any load from the lower memory cells CM2D. Therefore, a data processing rate for the upper memory cells CM2U may increase and an operation current or power consumption of the second cell matrix CM2 may be reduced. As a result, when the switching device SW 820 is turned off, the second cell matrix CM2 may be able to operate as fast memory cells.

Referring to FIG. 8B, a DRAM may include a first cell matrix CM1, a second cell matrix CM2, a sense amplifier (SA) 80-12 that is disposed between the first cell matrix CM1 and the second cell matrix CM2, a sense amplifier (SA) 80-01 that is disposed over the first cell matrix CM1, and a sense amplifier (SA) 80-23 that is disposed below the second cell matrix CM2, with respect to the orientation illustrated in FIG. 8B. A portion of memory cells of the first cell matrix CM1, e.g., right-side memory cells, may be coupled to the sense amplifier 80-12 through a bit line BL1. A portion of memory cells of the second cell matrix CM2, e.g., right-side memory cells, may be coupled to the sense amplifier 80-12 through the bit line BL1. Another portion of the memory cells of the first cell matrix CM1, e.g., left-side memory cells, may be coupled to the sense amplifier 80-01 through a bit line BL2. Another portion of the memory cells of the second cell matrix CM2, e.g., left-side memory cells, may be coupled to the sense amplifier 80-23 through the bit line BL2. In a case of the sense amplifier 80-12, the bit lines BL1 and BL2 may be a pair of bit lines BL and BLB (or /BL). In a case of the sense amplifier 80-01, the bit lines BL2 and BL1 may be a pair of bit lines BL and BLB (or /BL). In a case of the sense amplifier 80-23, the bit lines BL2 and BL1 may be a pair of bit lines BL and BLB (or /BL).

In the first cell matrix CM1, each of the right-side memory cells and each of the left-side memory cells are coupled between each of the word lines WL0 to WL3 and the bit line BL2.

The right-side memory cells of the first cell matrix CM1 that are coupled to the bit line BL1 may be divided into lower right-side memory cells CM1D and upper right-side memory cells CM1U. The lower right-side memory cells CM1D are disposed at positions that are less than a first distance from the sense amplifier 80-12 and are relatively close to the sense amplifier 80-12. The upper right-side memory cells CM1U are disposed at positions that are more than a second distance from the sense amplifier 80-12 and are relatively far from the sense amplifier 80-12. The second distance is longer than the first distance. A switching device SW 811 may be disposed between the upper right-side memory cells CM1U and the lower right-side memory cells CM1D. The switching device SW 811 may be turned on or off by the controller 410 shown in FIG. 6A.

When the switching device SW 811 is turned on, the upper right-side memory cells CM1U and the lower right-side memory cells CM1D are coupled to each other. The right-side memory cells of the first cell matrix CM1 may operate as normal memory cells. On the other hand, when the switching device SW 811 is turned off, the upper right-side memory cells CM1U are cut off from the lower right-side memory cells CM1D, and the right-side memory cells of the first cell matrix CM1 may operate as fast memory cells. When the upper right-side memory cells CM1U are cut off from the lower right-side memory cells CM1D, the bit line BL1 may not bear any load from the upper right-side memory cells CM1U. Therefore, a data processing rate for the lower right-side memory cells CM1D coupled to the bit line BL1 may increase, and an operation current or power consumption of the right-side memory cells of the first cell matrix CM1 may be reduced. As a result, when the switching device SW 811 is turned off, the right-side memory cells of the first cell matrix CM1 that are coupled to the bit line BL1 may be able to operate as fast memory cells.

The left-side memory cells of the first cell matrix CM1 that are coupled to the bit line BL2 may be divided into upper left-side memory cells CM1U and lower left-side memory cells CM1D. The upper left-side memory cells CM1U are disposed at positions that are less than a third distance from the sense amplifier 80-01 and are relatively close to the sense amplifier 80-01, and the lower left-side memory cells CM1D are disposed at positions that are more than a fourth distance from the sense amplifier 80-01 and are relatively far from the sense amplifier 80-01. The fourth distance is longer than the third distance. A switching device SW 812 may be disposed between the upper left-side memory cells CM1U and the lower left-side memory cells CM1D. The switching device SW 812 may be turned on or off by the controller 410 shown in FIG. 6A.

When the switching device SW 812 is turned on, the upper left-side memory cells CM1U and the lower left-side memory cells CM1D, which are coupled to the bit line BL2 and are coupled to each other, and the left-side memory cells of the first cell matrix CM1, which are coupled to the bit line BL2, may operate as normal memory cells. On the other hand, when the switching device SW 812 is turned off, the lower left-side memory cells CM1D are cut off from the upper left-side memory cells CM1U, and the left-side memory cells of the first cell matrix CM1 may operate as fast memory cells. When the lower left-side memory cells CM1D are cut off from the upper left-side memory cells CM1U, the bit line BL2 may not bear any load from the lower left-side memory cells CM1D. Therefore, a data processing rate for the upper left-side memory cells CM1U may increase and an operation current or power consumption of the left-side memory cells of the first cell matrix CM1 may be reduced. As a result, when the switching device SW 812 is turned off, the left-side memory cells of the first cell matrix CM1 may be able to operate as fast memory cells.

The right-side memory cells of the second cell matrix CM2 may be divided into upper right-side memory cells CM2U and lower right-side memory cells CM2D. The upper right-side memory cells CM2U are disposed at positions that are less than the first distance from the sense amplifier 80-12, and are relatively close to the sense amplifier 80-12. The lower right-side memory cells CM2D are disposed at positions that are more than the second distance from the sense amplifier 80-12 and are relatively far from the sense amplifier 80-12. A switching device SW 821 may be disposed between the upper right-side memory cells CM2U and the lower right-side memory cells CM2D. The switching device SW 821 may be turned on or off by the controller 410 shown in FIG. 6A.

When the switching device SW 821 is turned on, the upper right-side memory cells CM2U and the lower right-side memory cells CM2D are coupled to each other, and the right-side memory cells of the second cell matrix CM2 may operate as normal memory cells. On the other hand, when the switching device SW 821 is turned off, the lower right-side memory cells CM2D are cut off from the upper right-side memory cells CM2U, and the right-side memory cells of the second cell matrix CM2 may operate as fast memory cells. When the lower right-side memory cells CM2D are cut off from the upper right-side memory cells CM2U, the bit line BL1 may not bear any load from the lower right-side memory cells CM2D. Therefore, a data processing rate for the upper right-side memory cells CM2U may increase and an operation current or power consumption of the right-side memory cells of the second cell matrix CM2 may be reduced. As a result, when the switching device SW 821 is turned off, the right-side memory cells of the second cell matrix CM2 may be able to operate as fast memory cells.

The left-side memory cells of the second cell matrix CM2 that are coupled to the bit line BL2 may be divided into lower left-side memory cells CM2D and upper left-side memory cells CM2U. The lower left-side memory cells CM2D are disposed at positions that are less than the third distance from the sense amplifier 80-23 and are relatively close to the sense amplifier 80-23. The upper left-side memory cells CM2U are disposed at positions that are more than the fourth distance from the sense amplifier 80-23 and are relatively far from the sense amplifier 80-23. A switching device SW 822 may be disposed between the upper left-side memory cells CM2U and the lower left-side memory cells CM2D. The switching device SW 822 may be turned on or off by the controller 410 shown in FIG. 6A.

When the switching device SW 822 is turned on, the upper left-side memory cells CM2U and the lower left-side memory cells CM2D are coupled to each other, and the left-side memory cells of the second cell matrix CM2 may operate as normal memory cells. On the other hand, when the switching device SW 822 is turned off, the upper left-side memory cells CM2U are cut off from the lower left-side memory cells CM2D, and the left-side memory cells of the second cell matrix CM2 may operate as fast memory cells. When the upper left-side memory cells CM2U are cut off from the lower left-side memory cells CM2D, the bit line BL2 may not bear any load from the upper left-side memory cells CM2U. Therefore, a data processing rate for the lower left-side memory cells CM2D may increase and an operation current or power consumption of the left-side memory cells of the second cell matrix CM2 may be reduced. As a result, when the switching device SW 822 is turned off, the left-side memory cells of the second cell matrix CM2 may be able to operate as fast memory cells.

According to the embodiments of the present disclosure described above, a converged memory device may include a plurality of memories and a controller. At least one memory among the memories in the converged memory device may include a sense amplifier and at least one cell matrix. The cell matrix includes at least one first region memory cell, at least one first region memory cell, and a switching device. The first region memory cell is disposed at a position that is less than a first distance from the sense amplifier, and the second region memory cell is disposed at a position that is more than a second distance from the sense amplifier, the second distance being longer than the first distance. The switching device is disposed between the first region memory cell and the second region memory cell. The at least one memory may include a Dynamic Random Access Memory (DRAM).

A method for operating the converged memory device described above may include receiving a request from a host and controlling the switching device disposed between the first region memory cell and the second region memory cell in such a manner that the first region memory cell is coupled to the sense amplifier and the second region memory cell is selectively decoupled from the sense amplifier in response to the request.

In various embodiments of the present disclosure, the number of first region memory cells and the number of second region memory cells may be the same or different.

In various embodiments of the present disclosure, the method for operating the converged memory device may further include sequentially outputting data from the first region memory cell and data from the second region memory cell through a data path. The data from the first region memory cell may be outputted before the data from the second region memory cell is received.

In various embodiments of the present disclosure, the method for operating the converged memory device may further include migrating predetermined data among the data for the second region memory cell into the first region memory cell and cloning the migrated data; as well as accessing the cloned data in the first region memory cell when the predetermined data is requested.

In various embodiments of the present disclosure, the predetermined data may include frequently used data, which is also referred to as 'hot data.'

In various embodiments of the present disclosure, the request may include a request corresponding to fast processing or low power consumption.

Figure 9:
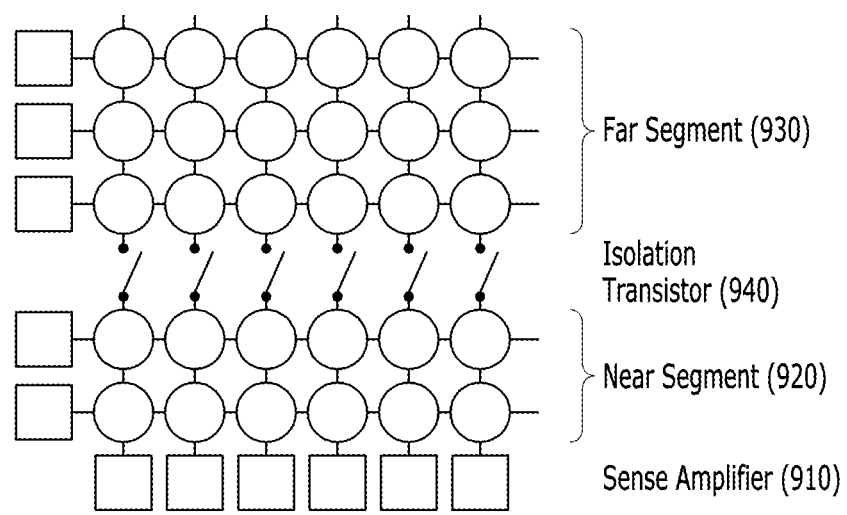
FIG. 9 illustrates a cell matrix including a switching device in accordance with an embodiment of the present disclosure.

FIG. 9 illustrates a cell matrix including a switching device in accordance with an embodiment of the present disclosure.

Referring to FIG. 9, the cell matrix may include near segment cells 920 and far segment cells 930. The near segment cells 920 are disposed relatively close to a sense amplifier 910, and the far segment cells 930 are disposed relatively far from the sense amplifier 910. Isolation transistors 940 may be disposed between the near segment cells 920 and the far segment cells 930. The isolation transistors 940 may be turned on or turned off by the controller 410, which is illustrated in FIG. 6A.

When the isolation transistors 940 are turned on, the far segment cells 930 and the near segment cells 920 are coupled to each other, and the cells in the cell matrix may operate as normal memory cells. When the isolation transistors 940 are turned off, the far segment cells 930 are cut off from the near segment cells 920 and the cells in the cell matrix may operate as fast memory cells.

The isolation transistors 940 may perform a turn-on or turn-off operation that couples or decouples the far segment cells 930 to or from the near segment cells 920. The isolation transistor 940 may be a constituent element within the switching devices 810, 811, 812, 820, 821, and 822 illustrated in FIGS. 8A and 8B.

Figure 10:
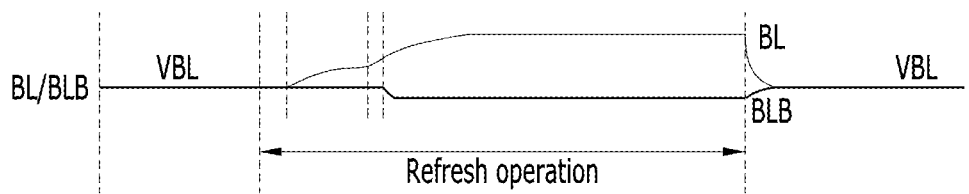
FIG. 10 illustrates a waveform of a refresh operation in a cell matrix having an asymmetrical bit line structure in accordance with an embodiment of the present disclosure.

FIG. 10 illustrates a waveform of an operation in a cell matrix having an asymmetrical bit line structure in accordance with an embodiment of the present disclosure. For example, FIG. 10 illustrates a waveform of a refresh operation corresponding to a case in which a cell matrix has an asymmetrical bit line structure as illustrated in FIG. 8B.

Referring to FIG. 10, when a switching device disposed on a bit line BLB out of a pair of bit lines BL and BLB (or /BL) is turned off, the load of the bit line BLB may be removed or decreased. In this case, a refresh memory cell coupled to the bit line BL may perform a restoring operation. Herein, a sense amplifier may perform a sensing and amplifying operation with no influence on the load of the bit line BLB. For example, referring to FIG. 8B, when a refresh operation is performed on the right-side memory cells of the cell matrix CM1 coupled to the bit line BL1, if the switching device SW 812 is turned off, the sense amplifier 80-12 may perform a sensing and amplifying operation with no influence on the load of the bit line BL2.

As described above, according to the embodiments of the present disclosure, a near memory cell positioned relatively close to a sense amplifier and a far memory cell positioned relatively far from the sense amplifier may be coupled to each other or decoupled from each other by a switching device in a cell matrix included in a DRAM among a plurality of DRAMs that may be included in a converged memory device such as a memory blade. When the far memory cell is decoupled from the near memory cell, a processing rate of the cell matrix may be improved, and a refresh power of the cell matrix may be decreased. Consequently, the performance of the converged memory device may be improved.

Figure 11A:
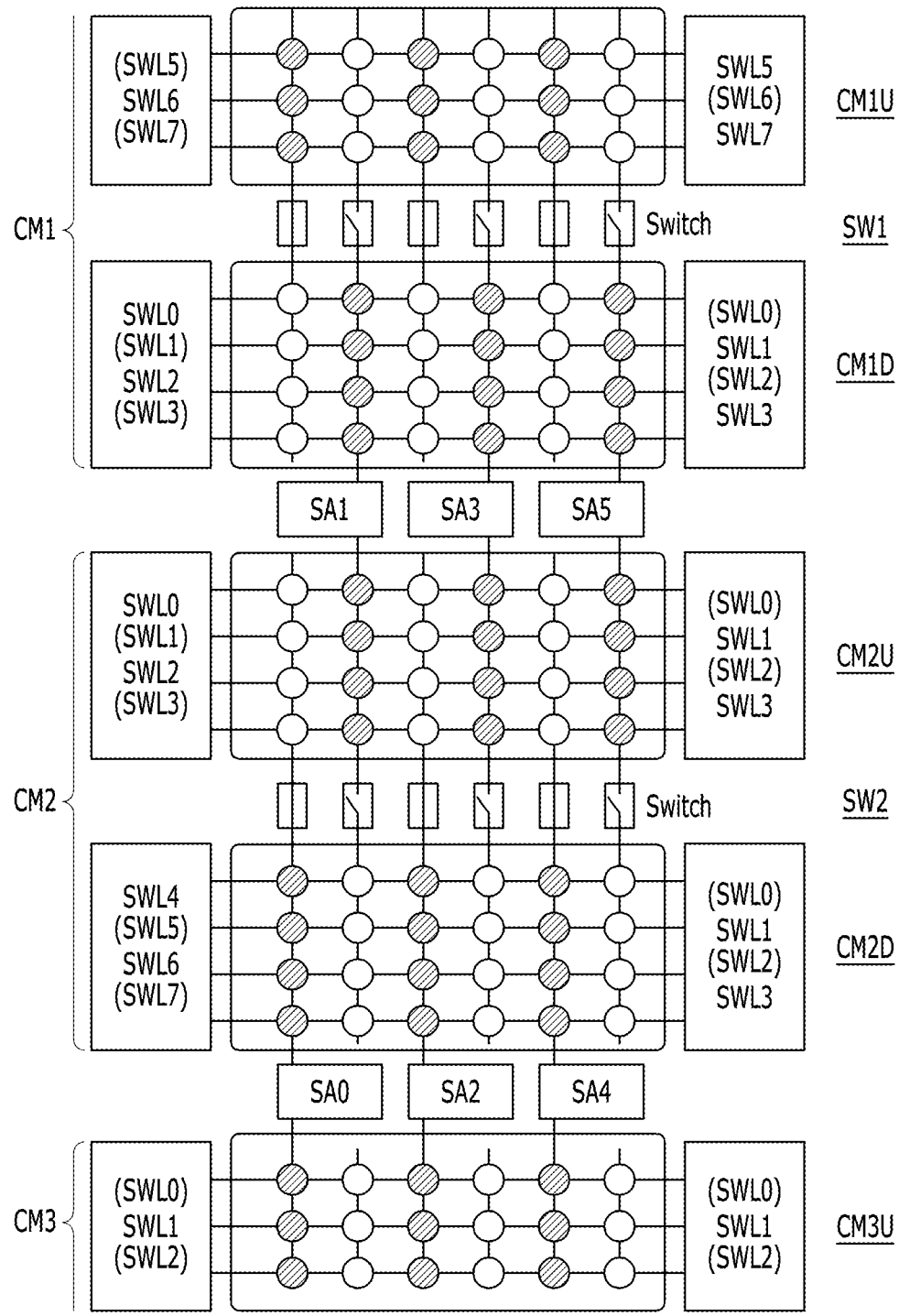
FIGS. 11A and 11B each illustrate a cell matrix having an asymmetrical bit line structure in accordance with an embodiment of the present disclosure.

FIG. 11A illustrates a cell matrix of a DRAM having an asymmetrical bit line structure in accordance with an embodiment of the present disclosure.

Referring to FIG. 11A, the DRAM may include a first cell matrix CM1, a second cell matrix CM2, a third cell matrix CM3, sense amplifiers SA1, SA3, and SA5, and sense amplifiers SA0, SA2, and SA4. The sense amplifiers SA1, SA3, and SA5 are disposed between the first cell matrix CM1 and the second cell matrix CM2, and the sense amplifiers SA0, SA2, and SA4 are disposed between the second cell matrix CM2 and the third cell matrix CM3.

The first cell matrix CM1 may include a plurality of lower memory cells CM1D, which are disposed between a plurality of word lines SWL0 to SWL3 and bit lines, and a plurality of upper memory cells CM1U, which are disposed between a plurality of word lines SWL5 to SWL7 and the bit lines. The first cell matrix CM1 may further include first switching devices SW1 that are disposed at a central part of the first cell matrix CM1. The first switching devices SW1 may be coupled to the bit lines between the upper memory cells CM1U and the lower memory cells CM1D. In an embodiment, the number of the upper memory cells CM1U and the number of the lower memory cells CM1D may be the same. The first switching devices SW1 may couple or decouple the upper memory cells CM1U to or from the lower memory cells CM1D.

In the first cell matrix CM1, right-side memory cells that are coupled to the sense amplifier SA1 may be divided into lower right-side memory cells CM1D, which are disposed at positions that are relatively close to the sense amplifier SA1, and upper right-side memory cells CM1U, which are disposed at positions that are relatively far from the sense amplifier SA1. The lower right-side memory cells CM1D and the upper right-side memory cells CM1U, among the right-side memory cells coupled to the sense amplifier SA1, may be isolated from each other by a corresponding one of the first switching devices SW1.

In the first cell matrix CM1, right-side memory cells coupled to the sense amplifier SA3 may be divided into lower right-side memory cells CM1D, which are disposed at positions that are relatively close to the sense amplifier SA3, and upper right-side memory cells CM1U, which are disposed at positions that are relatively far from the sense amplifier SA3. The lower right-side memory cells CM1D and the upper right-side memory cells CM1U may be isolated from each other by a corresponding one of the first switching devices SW1.

In the first cell matrix CM1, right-side memory cells coupled to the sense amplifier SA5 may be divided into lower right-side memory cells CM1D, which are disposed relatively close to the sense amplifier SA5, and upper right-side memory cells CM1U, which are disposed relatively far from the sense amplifier SA5. The lower right-side memory cells CM1D and the upper right-side memory cells CM1U may be isolated from each other by a corresponding one of the first switching devices SW1.

The second cell matrix CM2 may include a plurality of upper memory cells CM2U, which are disposed between the word lines SWL0 to SWL3 and bit lines, and a plurality of lower memory cells CM2D, which are disposed between the word lines SWL4 to SWL7 and the bit lines. The second cell matrix CM2 may further include second switching devices SW2 that are disposed at a central part of the second cell matrix CM2. The second switching devices SW2 may be coupled to the bit lines between the upper memory cells CM2U and the lower memory cells CM2D, where the number of the upper memory cells CM2U and the number of the lower memory cells CM2D may be the same. The second switching devices SW2 may couple or decouple the upper memory cells CM2U to or from the lower memory cells CM2D.

In the second cell matrix CM2, right-side memory cells that are coupled to the sense amplifier SA1 may be divided into upper right-side memory cells CM2U, which are disposed relatively close to the sense amplifier SA1, and lower right-side memory cells CM2D, which are disposed relatively far from the sense amplifier SA1. The upper right-side memory cells CM2U and the lower right-side memory cells CM2D may be isolated from each other by a corresponding one of the second switching devices SW2.

In the second cell matrix CM2, right-side memory cells that are coupled to the sense amplifier SA3 may be divided into upper right-side memory cells CM2U, which are disposed at positions that are relatively close to the sense amplifier SA3, and lower right-side memory cells CM2D, which are disposed at positions that are relatively far from the sense amplifier SA3. The upper right-side memory cells CM2U and the lower right-side memory cells CM2D may be isolated from each other by a corresponding one of the second switching devices SW2.

In the second cell matrix CM2, right-side memory cells that are coupled to the sense amplifier SA5 may be divided into upper right-side memory cells CM2U, which are disposed relatively close to the sense amplifier SA5, and lower right-side memory cells CM2D, which are disposed relatively far from the sense amplifier SA5. The upper right-side memory cells CM2U and the lower right-side memory cells CM2D may be isolated from each other by a corresponding one of the second switching devices SW2.

In the second cell matrix CM2, left-side memory cells that are coupled to the sense amplifier SA0 may be divided into lower left-side memory cells CM2D, which are disposed relatively close to the sense amplifier SA0, and upper left-side memory cells CM2U, which are disposed relatively far from the sense amplifier SA0. The lower left-side memory cells CM2D and the upper left-side memory cells CM2U may be coupled to each other by a corresponding one of the second switching devices SW2.

In the second cell matrix CM2, left-side memory cells that are coupled to the sense amplifier SA2 may be divided into lower left-side memory cells CM2D, which are disposed relatively close to the sense amplifier SA2, and upper left-side memory cells CM2U, which are disposed relatively far from the sense amplifier SA2. The lower left-side memory cells CM2D and the upper left-side memory cells CM2U may be coupled to each other by a corresponding one of the second switching devices SW2.

In the second cell matrix CM2, left-side memory cells that are coupled to the sense amplifier SA4 may be divided into lower left-side memory cells CM2D, which are disposed relatively close to the sense amplifier SA4, and upper left-side memory cells CM2U, which are disposed relatively far from the sense amplifier SA4. The lower left-side memory cells CM2D and the upper left-side memory cells CM2U may be coupled to each other by a corresponding one of the second switching devices SW2.

The switching devices SW1 and SW2 may be turned on or off under the control of the controller 410 illustrated in FIG. 6A. When a word line is enabled and a sense amplifier is enabled, the controller 410 may detect a position of the enabled word line based on address information, and control the switching devices SW1 and SW2 based on the detected position of the enabled word line. When memory cells that are disposed relatively far from the sense amplifier are decoupled from the sense amplifier by controlling the switching devices SW1 and SW2, the decoupled memory cells are not regarded as loading targets. In this way, memory cells that are disposed close to the sense amplifier may attain an improved Delta-V due to the improvement in a Cb/Cs ratio, and an improved operation rate and reduced operation current consumption due to the decrease in the loading that occurs when the sense amplifier is enabled.

For example, when the word line SWL1 of the second cell matrix CM2 is enabled, the sense amplifiers SA1, SA3, and SA5 may sense the near memory cells CM2U and may not load the far memory cells CM2D, which are decoupled from the near memory cells, by controlling the switching devices SW2. Therefore, the near memory cells CM2U may attain a higher Delta-V, an improved operation rate, and a reduced operation current consumption due to the decrease in bit line loading. Conversely, when the word line SWL1 of the second cell matrix CM2 is enabled, the sense amplifiers SA0, SA2, and SA4 and the lower memory cells CM2D are in a region far from the word line SWL1, and the coupling between the lower memory cells CM2D and the upper memory cells CM2U may be maintained through the switching devices SW2. In short, half of the entire group of enabled memory cells may become near memory cells that are disposed close to a sense amplifier, and the other half of the group may become far memory cells that are disposed far from the sense amplifier.

Therefore, when an operation such as a read operation, a write operation, an access operation, or a refresh operation is performed in one DRAM chip, half of the entire group of memory cells may have an improved operation rate, and thus their power consumption may be decreased. In other words, it is possible to improve an operation rate and power consumption of near memory cells that are disposed close to a sense amplifier by properly controlling switching devices that are disposed between one upper half of the entire memory cells and the other lower half of the entire memory cells. Therefore, if a controller is capable of properly allocating a memory in a converged memory device, such as a pooled memory, in consideration of what is described above, the overall performance of a system including the converged memory device may be improved. In addition, the converged memory device, which converges DRAMs that have an asymmetrical bit line structure, may divide the DRAMs into fast DRAMs and normal DRAMs by adjusting the number of the fast DRAMs and the number of the normal DRAMs, and may use the DRAMs as virtual memories.

Figure 11B:
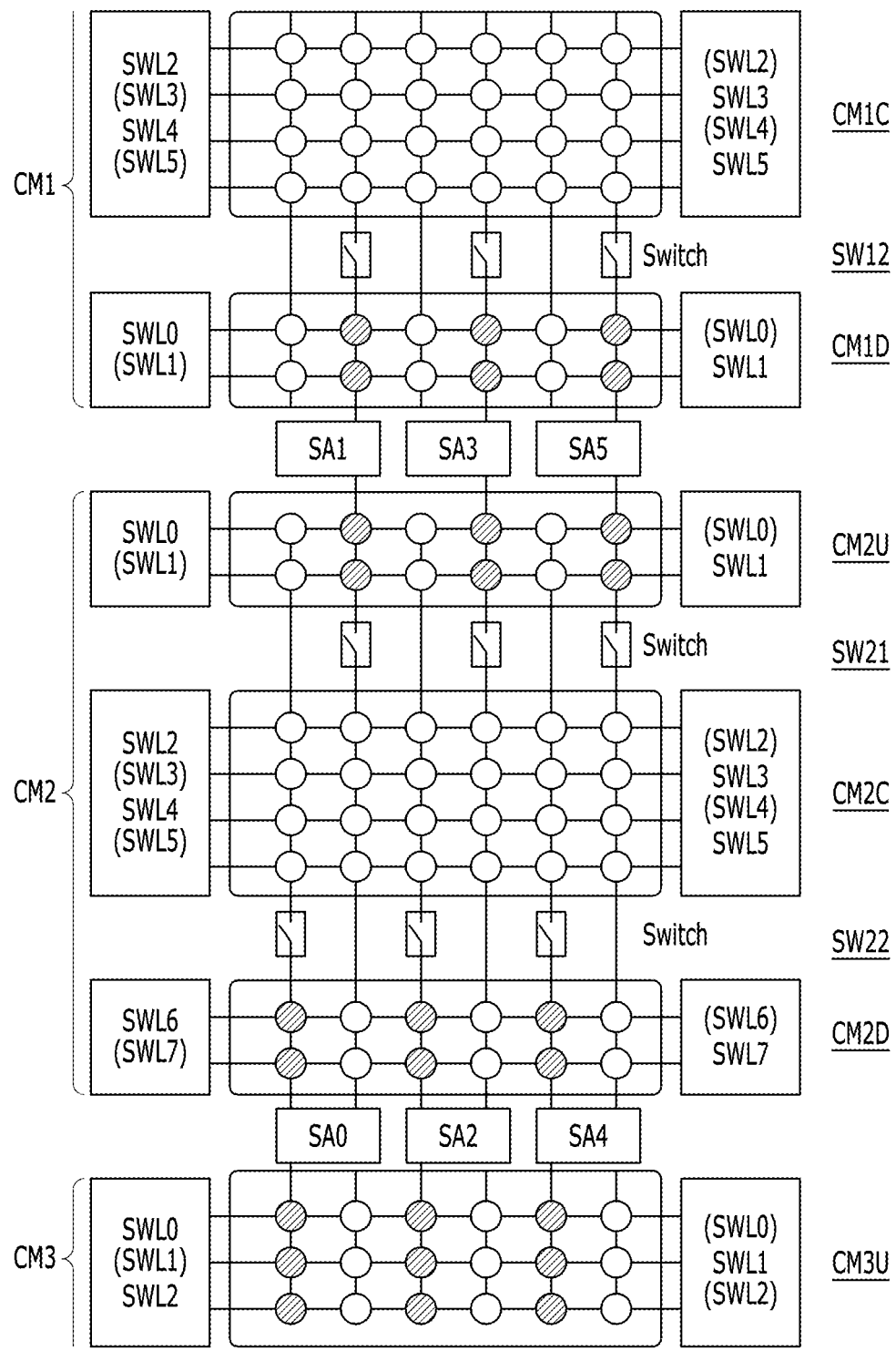

FIG. 11B illustrates a cell matrix of a DRAM having an asymmetrical bit line structure in accordance with an embodiment of the present disclosure.

Referring to FIG. 11B, the DRAM may include a first cell matrix CM1, a second cell matrix CM2, a third cell matrix CM3, sense amplifiers SA1, SA3, and SA5, and sense amplifiers SA0, SA2, and SA4. The sense amplifiers SA1, SA3, and SA5 are disposed between the first cell matrix CM1 and the second cell matrix CM2. The sense amplifiers SA0, SA2, and SA4 are disposed between the second cell matrix CM2 and the third cell matrix CM3.

The first cell matrix CM1 may include a plurality of lower memory cells CM1D, which are disposed between a plurality of word lines SWL0 to SWL2 and bit lines, a plurality of central memory cells CM1C, which are disposed between a plurality of word lines SWL2 to SWL5 and the bit lines, and a plurality of upper memory cells (not shown). The first cell matrix CM1 may further include switching devices SW12 that are disposed between the central memory cells CM1C and the lower memory cells CM1D. For example, the switching devices SW12 may be disposed at a ¼ position of the first cell matrix CM1 from the sense amplifiers SA1, SA3, and SA5. That is, the switching devices SW12 may be disposed ¼ of a distance from the sense amplifiers SA1, SA3, and SA5 to the first cell matrix CM1. The switching devices SW12 may be coupled to the bit lines between the central memory cells CM1C and the lower memory cells CM1D, so as to couple or decouple the central memory cells CM1C to or from the lower memory cells CM1D.

The second cell matrix CM2 may include a plurality of upper memory cells CM2U, which are disposed between a plurality of word lines SWL0 and SWL1 and bit lines, a plurality of central memory cells CM2C, which are disposed between a plurality of word lines SWL2 to SWL5 and the bit lines, and a plurality of lower memory cells CM2D, which are disposed between a plurality of word lines SWL6 and SWL7 and the bit lines. The second cell matrix CM2 may further include switching devices SW21, which are disposed between the upper memory cells CM2U and the central memory cells CM2C, as well as switching devices SW22, which are disposed between the central memory cells CM2C and the lower memory cells CM2D.

For example, the switching devices SW21 may be disposed at a ¼ position of the second cell matrix CM2 from the sense amplifiers SA1, SA3, and SA5, and the switching devices SW22 may be disposed at a ¼ position of the second cell matrix CM2 from the sense amplifiers SA0, SA2, and SA4. The switching devices SW21 may be coupled to the bit lines between the upper memory cells CM2U and the central memory cells CM2C, where the number of the upper memory cells CM2U and the number of the central memory cells CM2C are different from each other. The switching devices SW21 may couple or decouple the upper memory cells CM2U to or from the central memory cells CM2C. The switching devices SW22 may be coupled to the bit lines between the central memory cells CM2C and the lower memory cells CM2D, where the number of the lower memory cells CM2D and the number of the central memory cells CM2C are different from each other. The switching devices SW22 may couple or decouple the central memory cells CM2C to or from the lower memory cells CM2D.

The switching devices SW12, SW21, and SW22 may be turned on or off under the control of the controller 410 illustrated in FIG. 6A. When a word line is enabled and a sense amplifier is enabled, the controller 410 may detect a position of the enabled word line based on address information, and control the switching devices SW12, SW21, and SW22 based on the detected position of the enabled word line. When far memory cells, which are disposed relatively far from the sense amplifier, are decoupled from the sense amplifier by controlling the switching devices, the far memory cells are not regarded as loading targets. In this way, near memory cells, which are disposed relatively close to the sense amplifier, may attain an improved Delta-V due to the improvement in a Cb/Cs ratio. Furthermore, an improved operation rate and reduced operation current consumption is enabled, due to the decrease in the loading that occurs when the sense amplifier.

Compared with the structure of FIG. 11A, the structure of FIG. 11B has a modified structure in which switching devices are disposed at a ¼ position of a cell matrix from a sense amplifier. In this case, the number of near memory cells that are relatively close to the sense amplifier may be decreased. As illustrated in FIG. 11A, when switching devices are disposed in a central area of the entire memory cells, i.e., at a ½ position that is ½ of the distance from a sense amplifier, the number of fast memory cells may be half of a total number of memory cells in a cell matrix, i.e., approximately 50% of the total number of memory cells in the cell matrix. However, as illustrated in FIG. 11B, when the switching devices are disposed close to the sense amplifier, i.e., at a ¼ position from the sense amplifier, the number of near memory cells that are used as fast memory cells may be a fourth of the total number of memory cells in the cell matrix, i.e., approximately 25% of the total number of memory cells in the cell matrix. Even through the number of fast memory cells is decreased, a Delta-V characteristic for each of the fast memory cells originating from a length of bit lines that becomes short may be even more improved. In other words, when the length of the bit lines shortens by half, a Delta-V for a memory cell may be improved twice as much as the Delta-V before the length of the bit lines is shortened. Since the bit lines are short, an operation rate of the memory cell may be improved and thus the power consumption of the memory cell may be reduced. Compared with the structure of FIG. 11A, the structure of the cell matrix illustrated in FIG. 11B may have more improvement even though the number of improved memory cells is decreased. According to another embodiment of the present disclosure, the switching devices may be disposed at a ⅙ position of the cell matrix from the sense amplifier, which will be described with reference to FIG. 15A. According to yet another embodiment of the present disclosure, the switching devices may be disposed at a ⅛ position of the cell matrix from the sense amplifier.

Described in the above are the cases of disposing and using the switching devices at the particular fixed positions in the cell matrix, such as at a ½ position, a ¼ position, a ⅙ position, and a ⅛ position, from the sense amplifier. However, if the switching devices are properly disposed in the cell matrix, the switching devices may be variably used. For example, when the switching devices are disposed at the ½ position and the ¼ position of the cell matrix from the sense amplifier, the switching devices disposed at the ½ position or the ¼ position may be controlled according to the type of request processed by the cell matrix. For example, when a request should be processed relatively quickly, the request is processed by controlling the switching devices disposed in the ¼ position. In contrast, when a request should be processed at an intermediate operation rate, the request is processed by controlling the switching devices disposed in the ½ position.

Figure 12A:
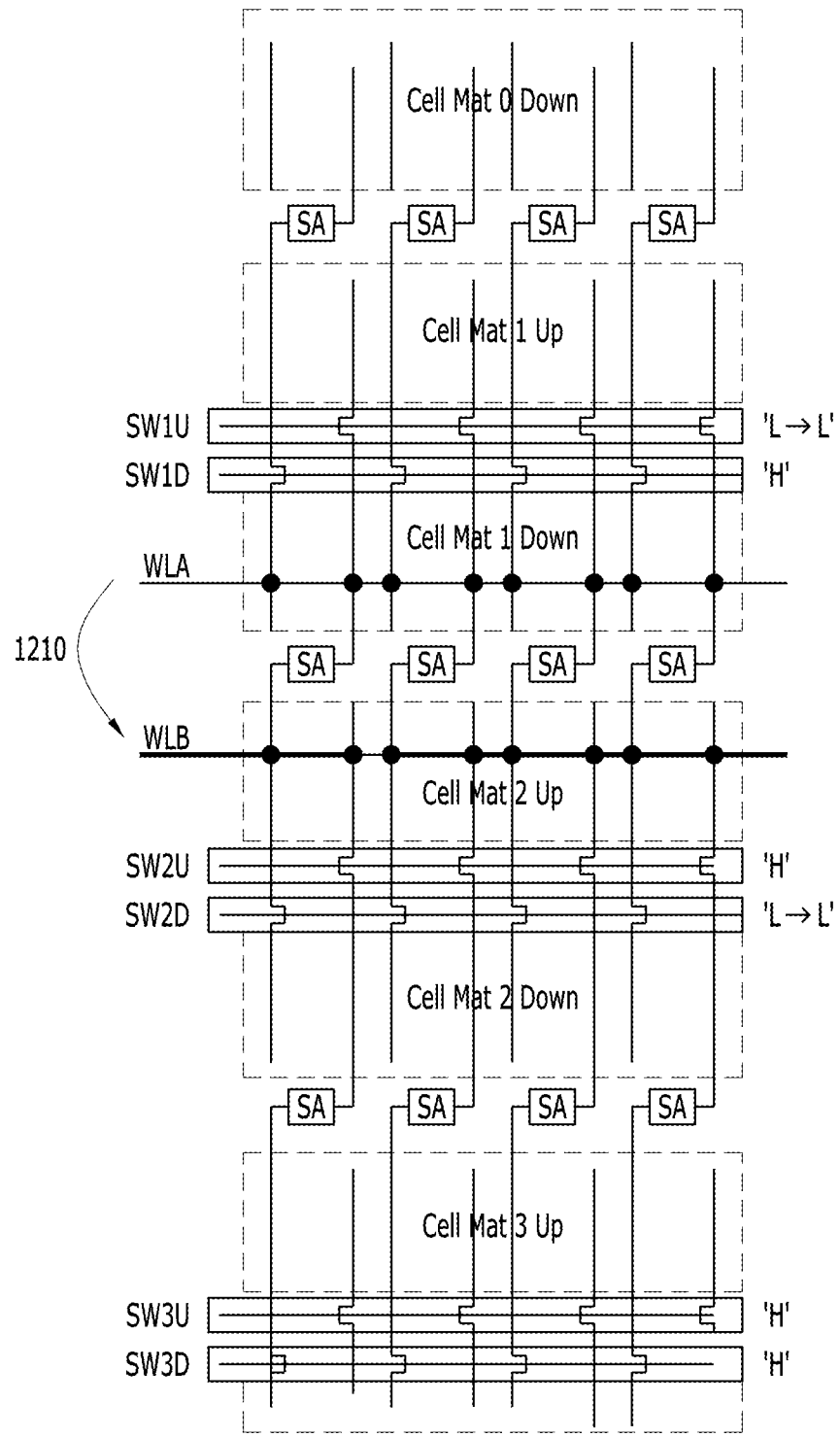
FIGS. 12A and 12B each illustrate a switch control operation in a cell matrix having an asymmetrical bit line structure in accordance with an embodiment of the present disclosure.
Figure 12B:
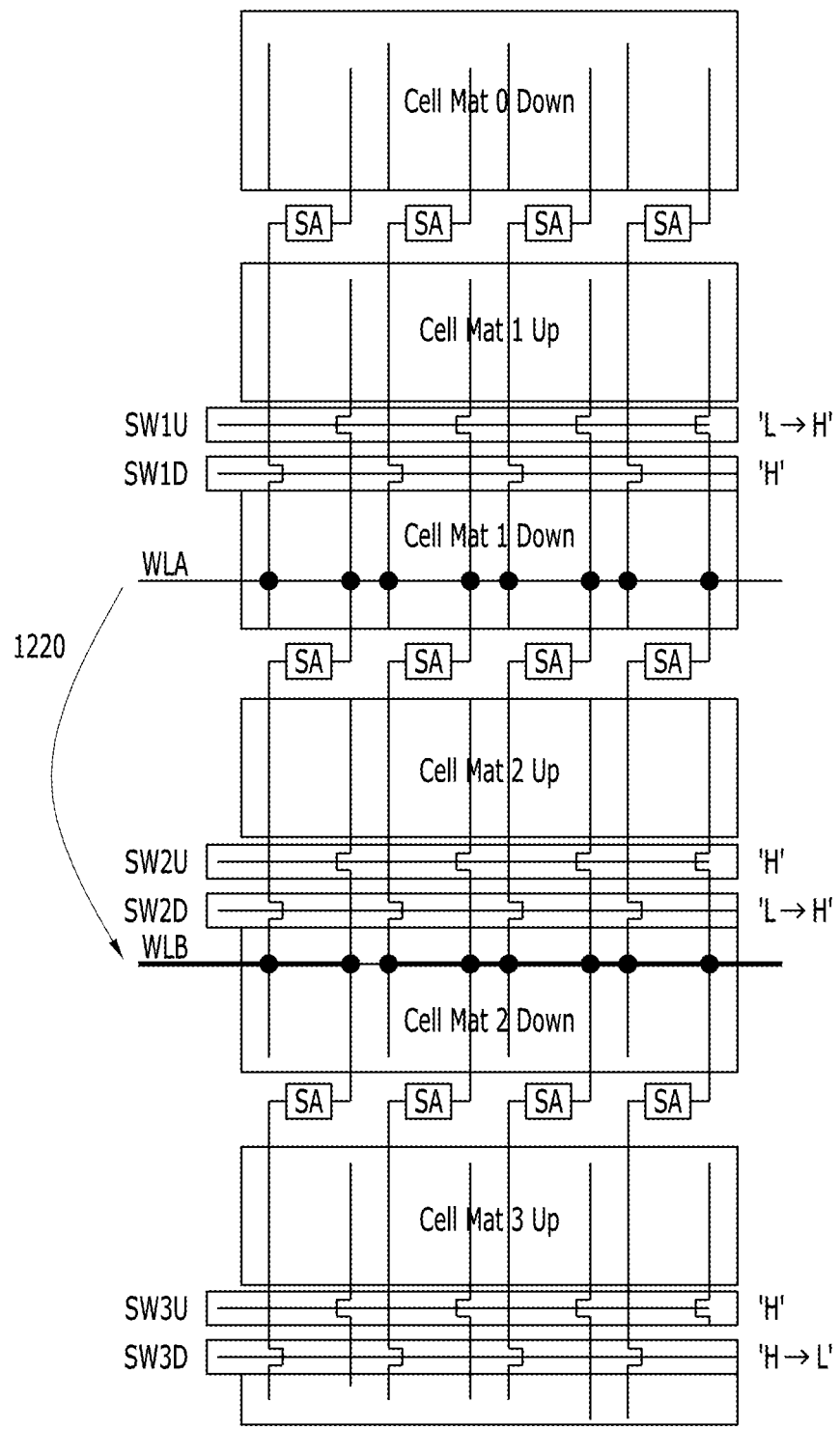

FIGS. 12A and 12B illustrate a switch control operation in a cell matrix having an asymmetrical bit line structure in accordance with an embodiment of the present disclosure.

Referring to FIGS. 12A and 12B, a DRAM may include a $0^{th}$ lower cell matrix (Cell Mat 0 Down), a first upper cell matrix (Cell Mat 1 Up), a first lower cell matrix (Cell Mat 1 Down), a second upper cell matrix (Cell Mat 2 Up), a second lower cell matrix (Cell Mat 2 Down), a third upper cell matrix (Cell Mat 3 Up), and a third lower cell matrix (not shown).

Switching devices may be disposed between cell matrices. Switching devices SW1U and SW1D may be disposed between the first upper cell matrix (Cell Mat 1 Up) and the first lower cell matrix (Cell Mat 1 Down). Switching devices SW2U and SW2D may be disposed between the second upper cell matrix (Cell Mat 2 Up) and the second lower cell matrix (Cell Mat 2 Down). Switching devices SW3U and SW3D may be disposed between the third upper cell matrix (Cell Mat 3 Up) and the third lower cell matrix (not shown).

When a word line WLA corresponding to the first lower cell matrix (Cell Mat 1 Down) is enabled, the switching devices SW1U and SW2D, which are coupled to sense amplifiers disposed close to the first lower cell matrix (Cell Mat 1 Down), are turned off (L), and the switching devices SW1D and SW2U, which are coupled to the other sense amplifiers, are turned on (H). When the switching devices SW1U are turned off, the first upper cell matrix (Cell Mat 1 Up) may be decoupled from the first lower cell matrix (Cell Mat 1 Down), and thus, the first lower cell matrix (Cell Mat 1 Down) corresponding to the activated word line WLA may operate as fast memory cells.

After the word line WLA is enabled, as illustrated in FIG. 12A, when a word line WLB corresponding to the second upper cell matrix (Cell Mat 2 Up) is enabled (1210), the switching devices SW1U and SW2D, which are coupled to the sense amplifiers disposed close to the second upper cell matrix (Cell Mat 2 Up), remain turned off (L), and the switching devices SW1D and SW2U remain turned on (H). At this time, the switching devices SW3U and SW3D remains turned on (H). When the switching devices SW2D are turned off, the second lower cell matrix (Cell Mat 2 Down) may be decoupled from the second upper cell matrix (Cell Mat 2 Up), and thus, the second upper cell matrix (Cell Mat 2 Up) corresponding to the activated word line WLB may operate as fast memory cells.

Meanwhile, after the word line WLA is enabled, as illustrated in FIG. 12B, when a word line WLB corresponding to the second lower cell matrix (Cell Mat 2 Down) is enabled (1220), the switching devices SW1U and SW2D, which are coupled to the sense amplifiers, are turned on (H), and the switching devices SW1D and SW2U remain turned on (H). At this time, the switching devices SW3U remain turned on (H), but the switching devices SW3D are turned off (L). When the switching devices SW2D are turned on, the second lower cell matrix (Cell Mat 2 Down) may be coupled to the second upper cell matrix (Cell Mat 2 Up), and thus, the second lower cell matrix (Cell Mat 2 Down) corresponding to the activated word line WLB may operate as normal memory cells.

Figure 13:
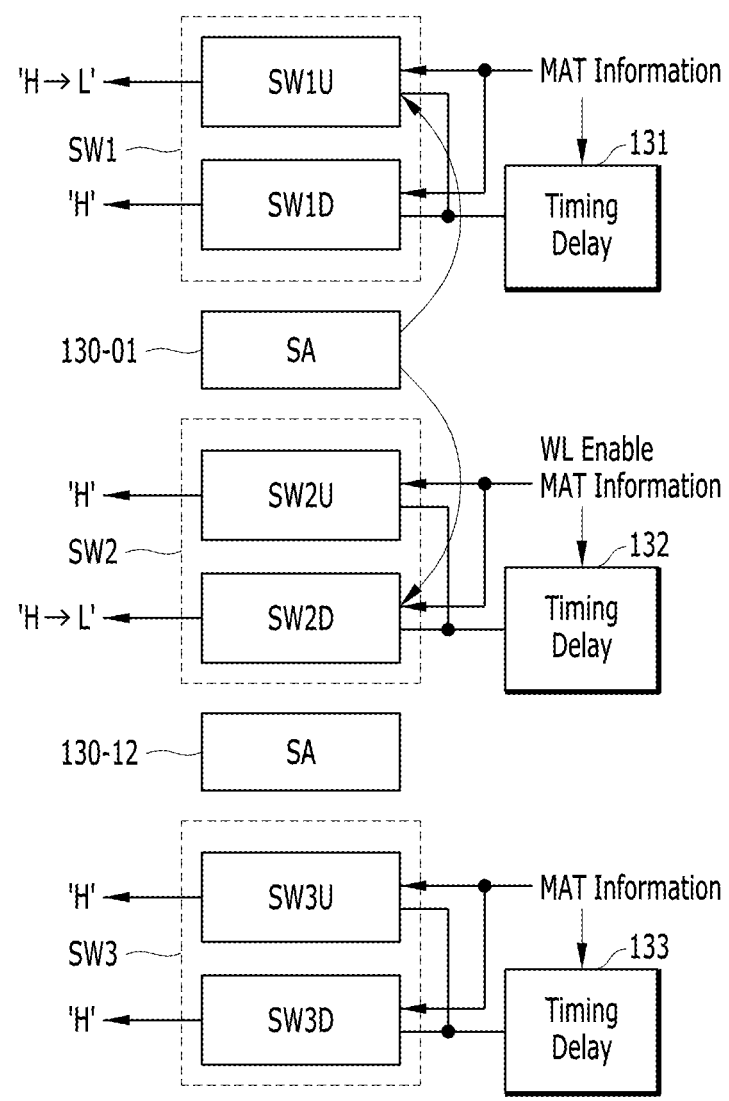
FIG. 13 illustrates a switch control operation for a cell matrix having an asymmetrical bit line structure in accordance with an embodiment of the present disclosure.

FIG. 13 illustrates a switch control operation for a cell matrix having an asymmetrical bit line structure in accordance with an embodiment of the present disclosure. FIG. 13 shows a switch control operation of the switching devices SW1U, SW1D, SW2U, SW2D, SW3U, and SW3D illustrated in FIG. 12A. The switch control operation may be controlled by the controller 410 illustrated in FIG. 6A.

Referring to FIG. 13, each of the switching devices may receive cell matrix information and delayed cell matrix information, which is obtained through a timing delay unit, and perform a switching operation in response to the received information. For example, the switching devices SW1 may receive cell matrix information and delayed cell matrix information, which is obtained through a timing delay unit 131, and may perform a switching operation in response to the received information.

When a word line coupled to the switching device SW2U is enabled, the switching devices SW2 may receive cell matrix information and delayed cell matrix information from a timing delay unit 132, and perform a switching operation in response to the received information. When there is an enabled word line, switching devices, which are coupled to the sense amplifier that is disposed the closest to the enabled word line, may be turned off. For example, as illustrated in FIGS. 12A and 13, the switching devices SW1U and SW2D coupled to a bit line that is coupled to a sense amplifier 130-01 that is disposed the closest to the enabled word line may be disabled from 'H' to 'L'. The switching devices SW3 may receive cell matrix information and delayed cell matrix information, which is obtained through a timing delay unit 133, and perform a switching operation in response to the received information.

Figure 14A:
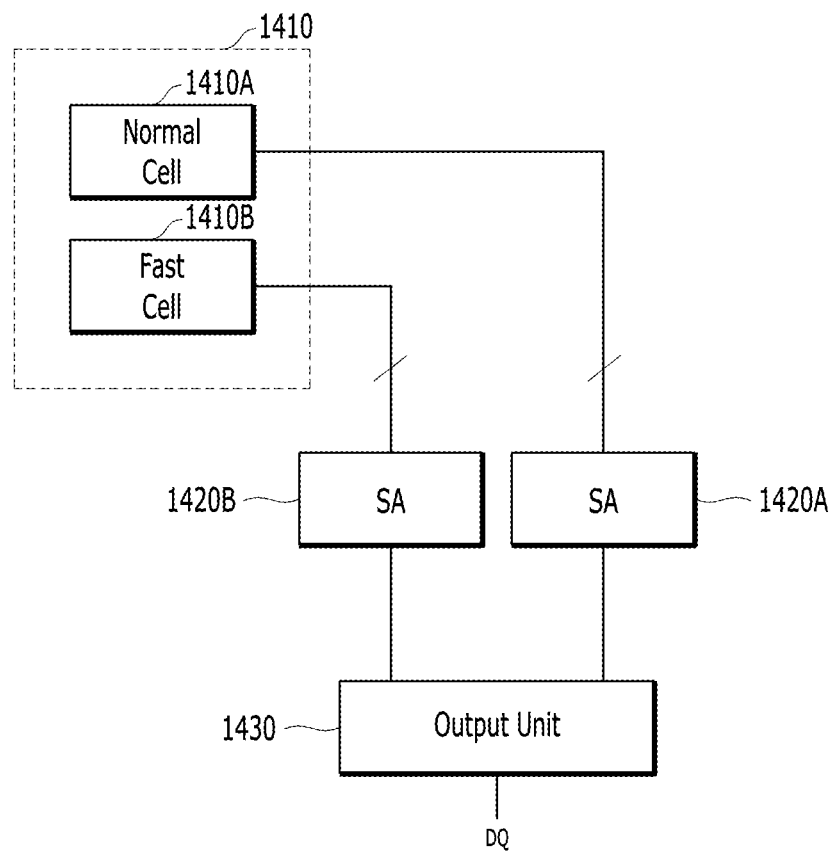
FIGS. 14A and 14B illustrate a pre-fetch operation in a cell matrix in accordance with an embodiment of the present disclosure.
Figure 14B:
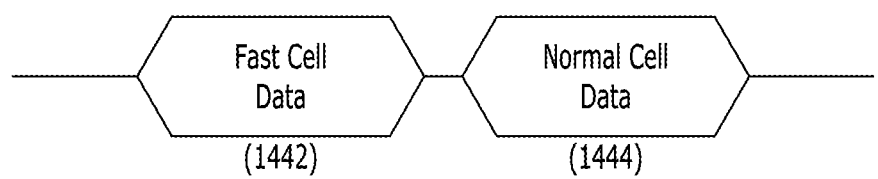

FIGS. 14A and 14B illustrate a pre-fetch operation in a cell matrix in accordance with an embodiment of the present disclosure.

Referring to FIG. 14A, a cell matrix 1410 may include a normal cell 1410A and a fast cell 1410B. Input/output sense amplifiers 1420A and 1420B and an output unit 1430 may be disposed on a data path between the cell matrix 1410 and a data pad DQ.

The fast cell 1410B, as described above, may represent a memory cell whose data access rate is increased due to an operation of a switching device included in the cell matrix in accordance with the embodiments of the present disclosure. Since the fast cell 1410B may be relatively close to the sense amplifier, a physical distance between the fast cell 1410B and the data pad DQ is relatively short. Conversely, the normal cell 1410A may represent a memory cell whose data access rate and physical distance to the data pad DQ are normal, compared to the fast cell 1410B.

The input/output sense amplifier 1420A may amplify and output data for the normal cell 1410A. The input/output sense amplifier 1420B may amplify and output data for the fast cell 1410B. The output unit 1430 may output data from the input/output sense amplifier 1420A and the input/output sense amplifier 1420B to the data pad DQ. The output unit 1430 may take an advantage of the fact that a data access time is different according to a position of a memory cell in a cell matrix, and may output data from the fast cell 1410B having the fast data access time first and then output data from the normal cell 1410A having the normal data access time. Alternatively, a pipeline of a typical data output unit may serially output data to a data pad DQ after all data are arrived. Therefore, in this case, the overall data access time may be limited by the slowest data path.

Referring to FIG. 14B, the output unit 1430 may output the data from the fast cell 1410B having the fast data access time first in step 1442, and then output the data from the normal cell 1410A in step 1444. Therefore, the output unit 1430 may be able to solve the problem of the overall data access time being limited by the slowest data path.

FIGS. 15A to 15D illustrate a cloning operation in a cell matrix in accordance with an embodiment of the present disclosure.

Figure 15A:
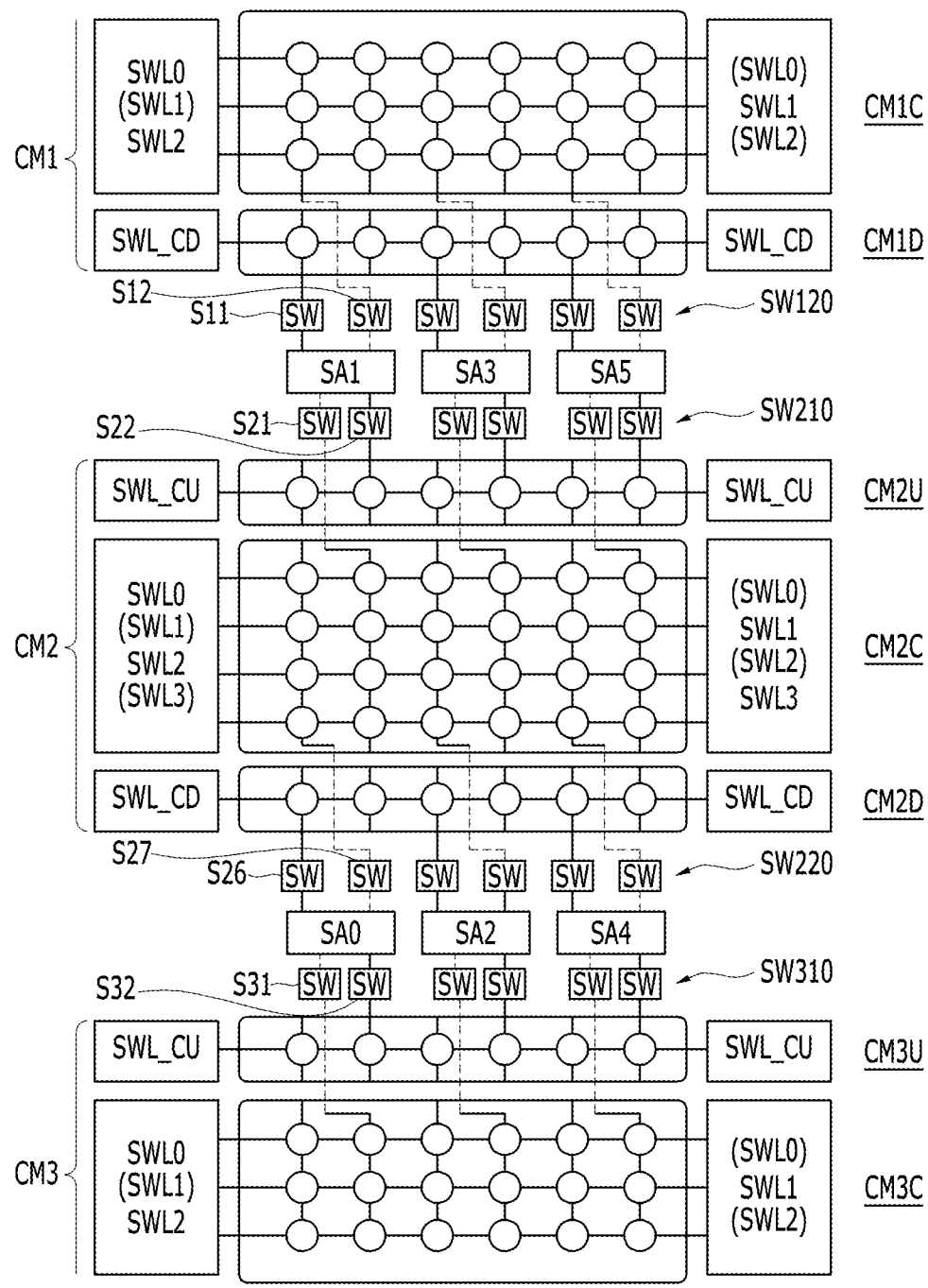
FIGS. 15A to 15D illustrate a cloning operation in a cell matrix in accordance with an embodiment of the present disclosure.

FIG. 15A illustrates a cell matrix of a DRAM in accordance with an embodiment of the present disclosure.

Referring to FIG. 15A, the DRAM may include a first cell matrix CM1, a second cell matrix CM2, a third cell matrix CM3, sense amplifiers SA1, SA3, and SA5, which are disposed between the first cell matrix CM1 and the second cell matrix CM2, and sense amplifiers SA0, SA2, and SA4, which are disposed between the second cell matrix CM2 and the third cell matrix CM3. The DRAM may further include switches SW120 that are coupled between the sense amplifiers SA1, SA3, and SA5 and the first cell matrix CM1, switches SW210 that are coupled between the sense amplifiers SA1, SA3, and SA5 and the second cell matrix CM2, switches SW220 that are coupled between the sense amplifiers SA0, SA2, and SA4 and the second cell matrix CM2, and switches SW310 that are coupled between the sense amplifiers SA0, SA2, and SA4 and the third cell matrix CM3.

The first cell matrix CM1 may include a plurality of lower memory cells CM1D that are disposed between a word line SWL_CD and bit lines, a plurality of central memory cells CM1C that are disposed between a plurality of word lines SWL0 to SWL2 and the bit lines. The central memory cells CM1C may be normal memory cells, and the lower memory cells CM1D may be cloning memory cells. Herein, although it is exemplarily illustrated that the central memory cells CM1C include normal memory cells, the central memory cells CM1C may include both of normal memory cells and fast memory cells, as shown in FIG. 11A or 11B.

The switches SW120 may include switches that are disposed between the sense amplifiers SA1, SA3, and SA5 and cloning memory cells of the first cell matrix CM1, and switches that are disposed between the sense amplifiers SA1, SA3, and SA5 and normal memory cells of the first cell matrix CM1. For example, the switches SW120 may include a switch SW11 and a switch SW12, which are disposed adjacent to each other. The switch SW11 is disposed between the sense amplifier SA1 and the cloning memory cell of the first cell matrix CM1, and the switch SW12 is disposed between the sense amplifier SA1 and the normal memory cell of the first cell matrix CM1. That is, the switch SW11 may couple the sense amplifier SA1 to the cloning memory cell of the first cell matrix CM1, and the switch SW12 may couple the sense amplifier SA1 to the normal memory cell of the first cell matrix CM1.

The second cell matrix CM2 may include a plurality of upper memory cells CM2U that are disposed between a word line SWL_CU and bit lines, a plurality of central memory cells CM2C that are disposed between a plurality of word lines SWL0 to SWL3 and the bit lines, and a plurality of lower memory cells CM2D that are disposed between a word line SWL_CD and the bit lines. The central memory cells CM2C may be normal memory cells, and the upper memory cells CM2U and the lower memory cells CM2D may be cloning memory cells. In the present embodiment, the central memory cells CM2C include only normal memory cells. However, the central memory cells CM2C may also include both of normal memory cells and fast memory cells, as illustrated in FIG. 11A or 11B.

The switches SW210 may include switches that are disposed between the sense amplifiers SA1, SA3, and SA5 and cloning memory cells of the second cell matrix CM2, and switches that are disposed between the sense amplifiers SA1, SA3, and SA5 and normal memory cells of the second cell matrix CM2. For example, the switches SW210 may include a switch SW21 and a switch SW22 that are disposed adjacent to each other. The switching SW210 is disposed between the sense amplifier SA1 and the normal memory cell of the second cell matrix CM2, and the switch SW22 is disposed between the sense amplifier SA1 and the cloning memory cell of the second cell matrix CM2. That is, the switch SW21 may couple the sense amplifier SA1 to a normal memory cell of the second cell matrix CM2, and the switch SW22 may couple the sense amplifier SA1 to a cloning memory cell of the second cell matrix CM2.

The switches SW220 may include switches that are disposed between the sense amplifiers SA0, SA2, and SA4 and cloning memory cells of the second cell matrix CM2, and switches that are disposed between the sense amplifiers SA0, SA2, and SA4 and normal memory cells of the second cell matrix CM2. For example, the switches SW220 may include a switch SW26 and a switch SW27, which are disposed adjacent to each other. The switch SW26 is disposed between the sense amplifier SA0 and a cloning memory cell of the second cell matrix CM2, and the switch SW27 is disposed between the sense amplifier SA0 and a normal memory cell of the second cell matrix CM2. That is, the switch SW26 may couple the sense amplifier SA0 to a cloning memory cell of the second cell matrix CM2, and the switch SW27 may couple the sense amplifier SA0 to a normal memory cell of the second cell matrix CM2.

The third cell matrix CM3 may include a plurality of upper memory cells CM3U that are disposed between a word line SWL_CU and bit lines, and a plurality of central memory cells CM3C that are disposed between a plurality of word lines SWL0 to SWL2 and the bit lines. The central memory cells CM3C may be normal memory cells, and the upper memory cells CM3U may be cloning memory cells. Herein, it is exemplarily illustrated that the central memory cells CM3C include only normal memory cells. However, the central memory cells CM3C may include both of normal memory cells and fast memory cells, as illustrated in FIG. 11A or 11B.

The switches SW310 may include switches that are disposed between the sense amplifiers SA0, SA2, and SA4 and cloning memory cells of the third cell matrix CM3, and switches that are disposed between the sense amplifiers SA0, SA2, and SA4 and normal memory cells of the third cell matrix CM3. For example, the switches SW310 may include a switch SW31 and a switch SW32, which are disposed adjacent to each other. The switch SW31 is disposed between the sense amplifier SA0 and a normal memory cell of the third cell matrix CM3, and the switch SW32 is disposed between the sense amplifier SA0 and a cloning memory cell of the third cell matrix CM3. That is, the switch SW31 may couple the sense amplifier SA0 to a normal memory cell of the third cell matrix CM3, and the switch SW32 may couple the sense amplifier SA0 and a cloning memory cell of the third cell matrix CM3.

In various embodiments of the present disclosure, cloning memory cells included in cell matrices may be disposed relatively close to a sense amplifier, and normal memory cells included in the cell matrices may be disposed relatively far from the sense amplifier. If it is possible to make a data access to a cloning memory cell disposed close to the sense amplifier instead of making a data access to a normal memory cell disposed far from the sense amplifier, a data access rate may be increased and bit line loading may be minimized. As a result, power consumption of the cell matrices may be reduced.

Figure 15B:
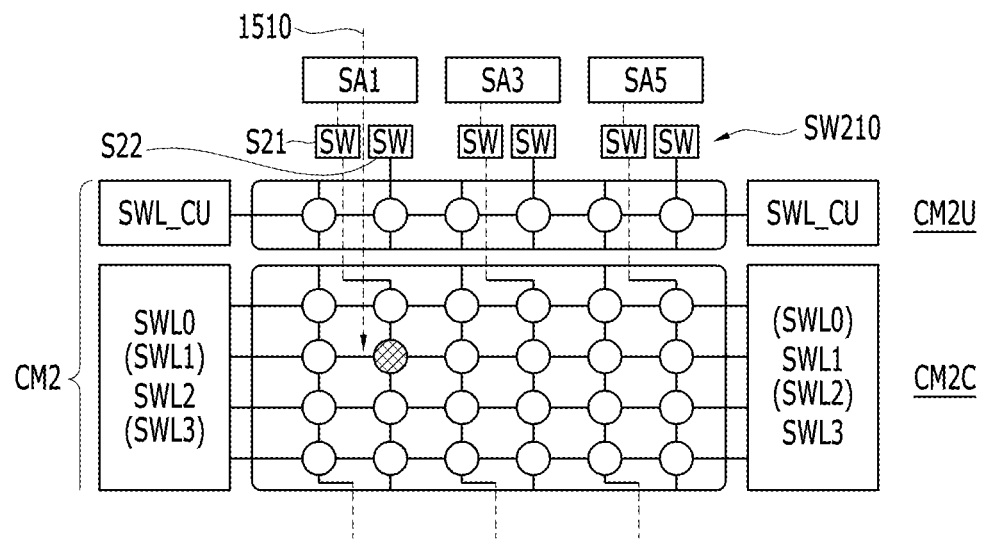
Figure 15C:
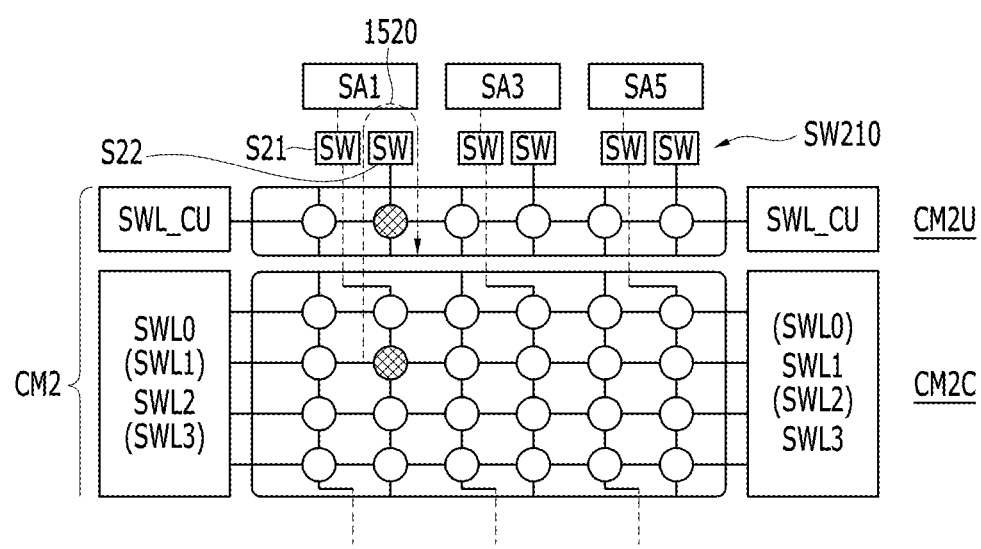
Figure 15D:
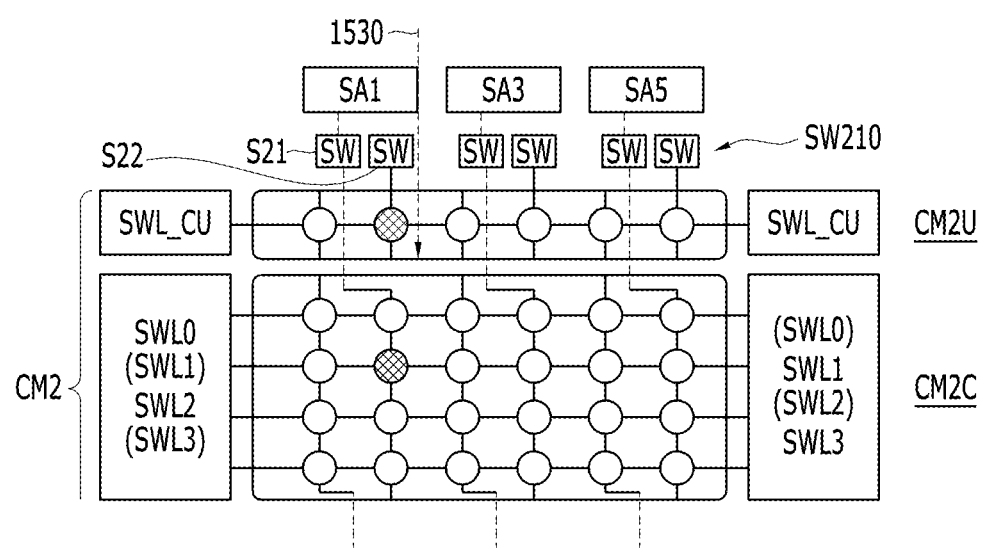

FIGS. 15B to 15D show a cloning operation in a cell matrix of the DRAM illustrated in FIG. 15A in accordance with an embodiment of the present disclosure. Herein, a cloning operation in the second cell matrix CM2 including the normal memory cells CM2C and the cloning memory cells CM2U is exemplarily illustrated. However, a cloning operation by other cloning memory cells may be performed similarly. Since the cloning operation makes it possible to make a data access not to the normal memory cells disposed far from the sense amplifier but to the cloning memory cells disposed close to the sense amplifier, the data access rate of the DRAM may be higher and bit line loading may be minimized. As a result, power consumption may be reduced.

Referring to FIG. 15B, data may be stored in the normal memory cells CM2C that are disposed relatively far from the sense amplifier SA1 among the memory cells included in the second cell matrix CM2. For example, data may be stored in a memory cell corresponding to the word line SWL1 among the normal memory cells CM2C through the switch SW21 which is turned on in step 1510.

Referring to FIG. 15C, data stored in the memory cell corresponding to the word line SWL1 among the normal memory cells CM2C may be cloned into some cloning memory cells among the cloning memory cells CM2U that are disposed relatively close to the sense amplifier SA1 among the memory cells included in the second cell matrix CM2 through the switches SW21 and SW22 that are turned on in step 1520. In various embodiments of the present disclosure, cloning of data may mean copying or moving of the data, and the cloned data may be predetermined data or data of a monitored normal memory cell, such as data of a frequently used page. Although FIG. 15C illustrates that the cloning is copying the data, it may be also illustrated as moving the data.

Referring to FIG. 15D, when an access request for the predetermined data or the data of the monitored normal memory cell is received after the cloning, the data may be accessed not from the normal memory cells CM2C but from the cloning memory cells CM2U in step 1530. In short, the cloned data stored in some cloning memory cells among the cloning memory cells CM2U that are disposed relatively close to the sense amplifier SA1 may be accessed through the switch SW 22 that is turned on. Since this cloned data are processed by accessing data that are not from the normal memory cells disposed far from the sense amplifier but from the cloning memory cells disposed close to the sense amplifier, the data access rate may become higher and bit line loading is minimized. As a result, power consumption may be reduced.

According to the embodiments of the present disclosure described above, near memory cells, which are disposed relatively close to a sense amplifier, and far memory cells, which are disposed relatively far from the sense amplifier, may be distinguished from each other by a switching device in a cell matrix in the inside of one DRAM among a plurality of DRAMs included in a converged memory device, such as a memory blade. When the far memory cells are distinguished from the near memory cells, a data processing rate may be improved and the refresh power may be reduced. Consequently, the performance of the converged memory device may be improved.

While the present disclosure has been described with respect to the specific embodiments, it will be apparent to those skilled in the art that various changes and modifications may be made without departing from the spirit and scope of the disclosure as defined in the following claims.

What is claimed is:

1. A converged memory device, comprising:
a plurality of memories, each of the plurality of memories comprising:
a sense amplifier;
one or more cell matrices that include one or more first region memory cells that are disposed less than a first distance from the sense amplifier and one or more second region memory cells that are disposed more than a second distance from the sense amplifier, the second distance being longer than the first distance; and
a switching device disposed between the first region memory cells and the second region memory cells in order to couple the second region memory cells to the sense amplifier or decouple the second region memory cells from the sense amplifier,
wherein when the switching device is enabled, the corresponding memory operates as a normal mode memory, and
wherein when the switching device is disabled, the corresponding memory operates as a fast mode memory which is faster than the normal mode memory; and
a controller configured to control the switching device of each of the plurality of memories to determine each of the plurality of memories as the normal mode memory or the fast mode memory, to select the fast mode memory for performing fast data processing in response to a request from a host, and to select the normal mode memory for performing normal data processing, a data processing rate of the normal data processing being lower than a data processing rate of the fast data processing.

2. The converged memory device of claim 1, wherein one or more of the plurality of memories include dynamic random access memories (DRAMs).

3. The converged memory device of claim 2, wherein the number of the first region memory cells is equal to the number of the second region memory cells.

4. The converged memory device of claim 2, wherein the number of the first region memory cells is different from the number of the second region memory cells.

5. The converged memory device of claim 2, wherein each of the plurality of memories further includes:
a data bus configured to sequentially output data from the first region memory cells and data from the second region memory cells through a data path, and to output the data from the first region memory cells before the data is received from the second region memory cells.

6. The converged memory device of claim 5, wherein each of the plurality of memories further includes:
a first amplifier configured to receive and amplify the data from the first region memory cells and to output the amplified data to the data bus; and
a second amplifier configured to receive and amplify the data from the second region memory cells and to output the amplified data to the data bus.

7. The converged memory device of claim 2, wherein the controller copies predetermined data among the data of the second region memory cells into the first region memory cells, and
when the predetermined data is requested, the controller accesses data stored in the first region memory cells that corresponds to the predetermined data.

8. The converged memory device of claim 7, wherein the predetermined data includes data of a monitored memory cell that is frequently used data.

9. The converged memory device of claim 2, wherein the controller selects the normal mode memory for performing a request consuming normal power, and selects the fast mode memory for performing a request consuming lower power than the normal power.

10. A method of operating a converged memory device that includes a memory including a sense amplifier and a cell matrix, the method comprising:

receiving a request from a host; and controlling a switching device disposed between one or more first region memory cells and one or more second region memory cells in order to couple the second region memory cells to the sense amplifier or decouple the second region memory cells from the sense amplifier in response to the request, wherein the switching device, the first region memory cells, and the second region memory cells are included in the cell matrix, the first region memory cells being disposed less than a first distance from the sense amplifier, the second region memory cells being disposed more than a second distance from the sense amplifier, the second distance being longer than the first distance, wherein when the second region memory cells are coupled to the sense amplifier, the memory operates as a normal mode memory, and wherein when the second region memory cells are decoupled from the sense amplifier, the memory operates as a fast mode memory which is faster than the normal mode memory.

11. The method of claim 10, wherein the memory includes a dynamic random access memory (DRAM).

12. The method of claim 11, wherein the number of the first region memory cells is equal to the number of the second region memory cells.

13. The method of claim 11, wherein the number of the first region memory cells is different from the number of the second region memory cells.

14. The method of claim 11, further comprising:
sequentially outputting data from the first region memory cells and data from the second region memory cells through a data path,
wherein the data from the first region memory cells are outputted before the data from the second region memory cells is received.

15. The method of claim 11, further comprising:
copying predetermined data among the data of the second region memory cells into the first region memory cells, and
when the predetermined data is requested, accessing data stored in the first region memory cells that corresponds to the predetermined data.

16. The method of claim 15, wherein the predetermined data includes data of a monitored memory cell that is frequently used data.

17. The method of claim 11, wherein the controlling the switching device includes:
when the request is a normal data processing request or a normal power consuming request, controlling the switching device to couple the second region memory cells to the sense amplifier, and when the request is a fast data processing request or a lower power consuming request, controlling the switching device to decouple the second region memory cells from the sense amplifier,
wherein a data processing rate of the fast data processing is higher than a data processing rate of the normal data processing, and the lower power consuming request consumes lower power than the normal power consuming request.

18. A memory device, comprising:
a plurality of cell matrices that includes a plurality of memory cells that are disposed between a plurality of word lines and a plurality of bit lines; and
a plurality of sense amplifiers that are disposed between the cell matrices,
wherein at least one cell matrix among the cell matrices includes:
one or more first region memory cells disposed less than a first distance from a sense amplifier;
one or more second region memory cells disposed more than a second distance from the sense amplifier, the second distance being longer than the first distance; and
switching devices disposed between the first region memory cells and the second region memory cells, the switching devices being controlled to couple the second region memory cells to the sense amplifier to operate the memory device as a normal mode memory and decouple the second region memory cells from the sense amplifier to operate the memory device as a fast mode memory which is faster than the normal mode memory.

19. The memory device of claim 18, wherein the bit lines are coupled to the sense amplifiers to have an asymmetrical structure.

20. The memory device of claim 19, wherein the number of the first region memory cells is equal to the number of the second region memory cells.

21. The memory device of claim 19, wherein the number of the first region memory cells is different from the number of the second region memory cells.

22. The memory device of claim 19, further comprising:
a data bus configured to sequentially output data from the first region memory cells and data from the second region memory cells through a data path, and to output the data from the first region memory cells before receiving of the data from the second region memory cells is completed.

23. The memory device of claim 22, further comprising:
a first amplifier configured to receive and amplify the data from the first region memory cells and to output the amplified data to the data bus; and
a second amplifier configured to receive and amplify the data from the second region memory cells and to output the amplified data to the data bus.

* * * * *